United States Patent
Ito et al.

(10) Patent No.: US 11,038,145 B2
(45) Date of Patent: Jun. 15, 2021

(54) LAMINATED FILM AND PROCESS FOR MANUFACTURING THE SAME, AS WELL AS METHOD FOR ANALYZING LAMINATED FILM

(71) Applicant: SUMITOMO CHEMICAL COMPANY, LIMITED, Tokyo (JP)

(72) Inventors: Yutaka Ito, Tsukuba (JP); Yukiko Takenaka, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/471,181

(22) Filed: Mar. 28, 2017

(65) Prior Publication Data

US 2017/0288169 A1    Oct. 5, 2017

(30) Foreign Application Priority Data

Mar. 31, 2016  (JP) .............................. JP2016-070406

(51) Int. Cl.
*H01L 51/52* (2006.01)
*H01L 51/00* (2006.01)
(Continued)

(52) U.S. Cl.
CPC ........ *H01L 51/5253* (2013.01); *C23C 16/401* (2013.01); *C23C 16/509* (2013.01);
(Continued)

(58) Field of Classification Search
None
See application file for complete search history.

(56) References Cited

U.S. PATENT DOCUMENTS 8,906,492 B2    12/2014  Suzuki et al.
2010/0166977 A1  7/2010  Brand et al.
(Continued)

FOREIGN PATENT DOCUMENTS

JP    2011-73430 A    4/2011
JP    4921612 B2      4/2012
(Continued)

OTHER PUBLICATIONS

Kobayashi, Characterization of gas barrier silica coatings prepared from perhydropolysilazane films by vacuum ultraviolet irradiation, Journal of the Ceramic Society of Japan 121 [2] 215-218 2013 (Year: 2013).*

(Continued)

*Primary Examiner* — James Choi
(74) *Attorney, Agent, or Firm* — Birch, Stewart, Kolasch & Birch, LLP

(57) ABSTRACT

A laminated film containing a gas barrier layer and an inorganic polymer layer laminated on a resin substrate, wherein a Y value calculated from a transmission electron microscope image of a cross section of the inorganic polymer layer by the following procedures (a) to (d) is 0.220 or less: (a) Calculating a standard deviation ($\sigma$) of the contrast of an electron beam-unirradiated part of the inorganic polymer layer; (b) Dividing an electron beam-irradiated part of the inorganic polymer layer into twenty parts having a film thickness equal in a film thickness direction, and calculating a standard deviation (an: standard deviation of $n^{th}$ division, n=1~20) of the contrast of each divided part; (c) Calculating Xn (n=1~20) of each divided part from the expression (1): $X_n = \sigma_n/\sigma$ (n=1~20) ... (1); and (d) A standard deviation of X3 to X18 is defined as Y.

4 Claims, 4 Drawing Sheets

(51) Int. Cl.
  *C23C 16/40* (2006.01)
  *C23C 16/509* (2006.01)
  *G01N 23/18* (2018.01)
  *H01J 37/244* (2006.01)
  *H01J 37/285* (2006.01)
  *H01L 51/56* (2006.01)
  *B05D 1/00* (2006.01)
  *B05D 3/06* (2006.01)

(52) U.S. Cl.
  CPC ............ *G01N 23/18* (2013.01); *H01J 37/244* (2013.01); *H01J 37/285* (2013.01); *H01L 51/0097* (2013.01); *H01L 51/56* (2013.01); *B05D 1/005* (2013.01); *B05D 3/067* (2013.01); *C23C 16/402* (2013.01); *H01L 2251/303* (2013.01); *Y02E 10/549* (2013.01); *Y02P 70/50* (2015.11)

(56) References Cited

U.S. PATENT DOCUMENTS

| | | |
|---|---|---|
| 2012/0107607 A1 | 5/2012 | Takaki et al. |
| 2014/0199544 A1* | 7/2014 | Naganawa ............... B05D 5/00 428/336 |
| 2015/0303398 A1* | 10/2015 | Ii ........................... H01L 51/442 257/40 |
| 2016/0312363 A1* | 10/2016 | Yamashita ............. C23C 16/507 |
| 2016/0315286 A1* | 10/2016 | Kuroki .................... H01L 51/56 |
| 2017/0288170 A1* | 10/2017 | Ito ........................... B05D 3/067 |
| 2017/0288171 A1* | 10/2017 | Ito ......................... H01L 51/5253 |
| 2019/0106595 A1* | 4/2019 | Shin ....................... C08G 77/62 |

FOREIGN PATENT DOCUMENTS

| | | |
|---|---|---|
| JP | 5183469 B2 | 4/2013 |
| JP | 5402818 B2 | 1/2014 |
| JP | 5585267 B2 | 9/2014 |
| JP | 5646478 B2 | 12/2014 |
| WO | WO 2014/141821 A1 | 9/2014 |
| WO | WO-2015098671 A1 * | 7/2015 ........... C23C 16/507 |

OTHER PUBLICATIONS

Tran et al. "Effects of cyclic deformation on a barrier thin film for flexible organic optoelectronic devices" 650 Thin Solid Films, vol. 20 (Mar. 31, 2018) (Year: 2018).*

* cited by examiner

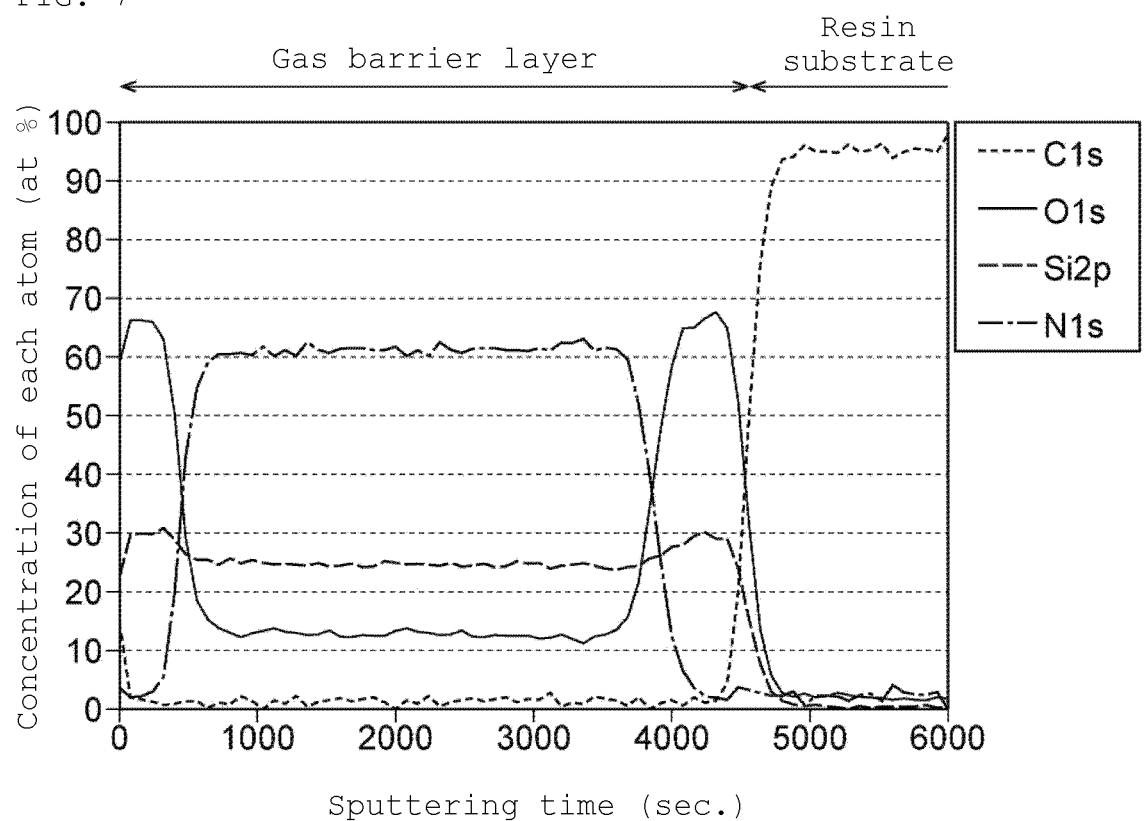

LAMINATED FILM AND PROCESS FOR MANUFACTURING THE SAME, AS WELL AS METHOD FOR ANALYZING LAMINATED FILM

BACKGROUND OF THE INVENTION

Field of the Invention

The present invention relates to a laminated film and a process for manufacturing the same, as well as a method for analyzing a laminated film.

Description of the Related Art

In recent years, as a self light-emitting element, an organic electroluminescent element (hereinafter, also referred to as "organic EL element") has been paid attention. The organic EL element is an element having a structure in which a light emitting layer of an organic compound is sandwiched by electrodes on a support substrate, which emits light by supplying an electric current between electrodes. The organic EL element is deteriorated when an oxygen gas and the water vapor enter the element, and a light emitting defective portion called dark spot is generated. For this reason, in the field of the organic EL element, in order to suppress an oxygen gas and the water vapor from entering the element, utilization of a substrate having high performance of preventing transmission of the gas such as the water vapor in the support substrate of a light emitting element portion thereof has been proposed.

As a substrate having gas transmission preventing performance utilized in the organic EL element, for example, a gas barriering laminated film provided with a substrate, and a thin film layer containing silicon, oxygen and carbon, which is formed on a surface thereof, has been proposed (e.g. see Patent Document 1).

PRIOR ART DOCUMENT

Patent Document

Patent Document 1: JP-A-2011-73430

SUMMARY OF THE INVENTION

The laminated film described in Patent Document 1 can afford high gas transmission preventing performance to the water vapor, but in recent years, the laminated film has been required to have water vapor transmission preventing performance at the further higher level.

The present invention was made in view of the problems possessed by the conventional technique, and an object thereof is to provide a laminated film which can prevent transmission of the water vapor at the higher level and a process for manufacturing it, as well as a method for analyzing a laminated film.

In order to attain the object, the present invention provides a laminated film comprising at least a gas barrier layer and an inorganic polymer layer being laminated on a resin substrate, wherein a Y value calculated from a transmission electron microscope image of a cross section of the inorganic polymer layer by the following procedures (a) to (d) is 0.220 or less.

(a) A standard deviation ($\sigma$) of the contrast of an electron beam-unirradiated part of the inorganic polymer layer is calculated. A standard deviation $\sigma$ is obtained by performing division into twenty of the inorganic polymer layer of a transmission electron microscope image obtained by photographing so that a gradation average value of a carbon deposition layer in a cross-sectional sample of the laminated film of a width of 90 nm, which was prepared by microsampling using a focused ion beam machining observation device, becomes 80 to 90 with a standard deviation of 3 to 5, so that divided ones have an equal film thickness in a film thickness direction, obtaining a standard deviation from a histogram when each cross section of $3^{rd}$ to $18^{th}$ divisions is gray scale-displayed at 256 gradations, and calculating a standard deviation ($\sigma$) as an average value thereof.

(b) An electron beam-irradiated part of the inorganic polymer layer is divided into twenty so that the divided ones have an equal film thickness in a film thickness direction, and a standard deviation of the contrast of each divided part ($\sigma n$: standard deviation of $n^{th}$ division, n=1~20) is calculated. A standard deviation $\sigma n$ is obtained by irradiating a cross-sectional sample of the laminated film having a width of 90 nm, which was prepared by microsampling using a focused ion beam machining observation device, with an electron beam at $1.30 \times 10^{16}$ ions/cm$^2$, and calculating a standard deviation from a histogram when a transmission electron microscope image obtained by photographing a cross section of each divided part of the inorganic polymer layer after electron irradiation under the same condition as that of a gradation average value of a carbon deposition layer set at (a) is gray scale-displayed at 256 gradations.

(c) $Xn$ (n=1~20) of each divided part is calculated from the expression (1).

$$Xn = \sigma n / \sigma (n=1\sim20) \quad (1)$$

(d) A standard deviation of X3 to X18 is defined as Y.

According to the laminated film, by provision with the inorganic polymer layer, a defect such as a crack or a via hole present in the gas barrier layer can be made up for, while gas barrier property of the inorganic polymer layer itself is added, and it becomes possible to prevent transmission of the water vapor at the higher level.

In the laminated film, the Y value is preferably 0.200 or less. When the Y value is 0.200 or less, a region in the sufficiently cured state becomes to sufficiently exist in the inorganic polymer layer, and it becomes possible to effectively make up for a defect such as a crack or a via hole present in the gas barrier layer, and stably prevent transmission of the water vapor at the higher level.

In the laminated film, the gas barrier layer may be a layer which was formed by chemical vapor deposition (CVD) method).

In the laminated film, it is preferable that the gas barrier layer is a silicon oxide-based layer which contains a silicon atom, an oxygen atom and a carbon atom, and satisfies all of the following conditions (i) to (iii), in a silicon distribution curve, an oxygen distribution curve and a carbon distribution curve, each showing a relationship between a distance from a surface of the gas barrier layer in a film thickness direction of the gas barrier layer, and the ratio of an amount of a silicon atom (atomic ratio of silicon), the ratio of an amount of an oxygen atom (atomic ratio of oxygen) or the ratio of an amount of a carbon atom (atomic ratio of carbon), to a total amount of a silicon atom, an oxygen atom and a carbon atom.

(i) The atomic ratio of silicon, the atomic ratio of oxygen and the atomic ratio of carbon satisfy the expression (2):

(Atomic ratio of oxygen)>(atomic ratio of silicon)> (atomic ratio of carbon)   (2)

in a region which is 90% or more of a film thickness of the gas barrier layer.
(ii) The carbon distribution curve has at least one extreme value.
(iii) An absolute value of a difference between a maximum value and a minimum value of the atomic ratio of carbon in the carbon distribution curve is 5 at % or more.

By the gas barrier layer having the above feature, the laminated film can afford more excellent barrier property to an oxygen gas and the water vapor, and at the same time, can afford excellent flex resistance.

In the laminated film, it is preferable that the gas barrier layer contains a silicon atom, an oxygen atom and a nitrogen atom, and the gas barrier layer is a silicon oxide-based layer satisfying all of the conditions (iv) and (v).
(iv) The gas barrier layer has a second thin film layer, a first thin film layer and a third thin film layer which have different oxygen content ratios, from a resin substrate side, and an average composition of a silicon atom, an oxygen atom and a nitrogen atom of the first thin film layer is in the range of 10 at %≤Si≤40 at %, 5 at %≤O≤30 at %, 50 at %≤N≤80 at %.
(v) The elemental ratio of a nitrogen atom and a silicon atom of the second and third thin film layers is in the range of the expression (3).

$$N/Si \leq 0.2 \quad (3).$$

By the gas barrier layer having the above feature, the laminated film can afford more excellent barrier property to an oxygen gas and the water vapor, and at the same time, can afford excellent flex resistance.

In the laminated film, it is preferable that the inorganic polymer layer is a layer composed of a curing product obtained by curing a composition containing an inorganic polymer by irradiation of vacuum ultraviolet light having the wavelength of 200 nm or less. Thereby, the inorganic polymer layer becomes in the suitable cured state for exerting the effect of the present invention, and the laminated film can prevent transmission of the water vapor at the higher level, and at the same time, can afford good flex resistance.

In the laminated film, the inorganic polymer layer is preferably a layer composed of a curing product of a composition containing polysilazane. Since polysilazane easily progresses a reaction by addition of a catalyst, and is easily modified to vitrify, and at the same time, the reaction is not a condensation reaction, but a substitution reaction, there is an advantage that the shrinkage rate is small. Additionally, since the molecular size of elimination components ($H_2$ and $NH_3$) which are generated in the reaction is small, a uniform film having high surface flatness is easily formed. For this reason, by the inorganic polymer layer being a layer composed of a curing product of a composition containing polysilazane, the laminated film can prevent transmission of the water vapor at the higher level.

The present invention also provides an analysis method for analyzing the cured state of an inorganic polymer layer in a laminated film comprising at least a gas barrier layer and the inorganic polymer layer being laminated on a resin substrate, comprising a step of calculating a Y value from a transmission electron microscope image of a cross section of the inorganic polymer layer by the following procedures (a) to (d).
(a) A standard deviation ($\sigma$) of the contrast of an electron beam-unirradiated part of the inorganic polymer layer is calculated. A standard deviation $\sigma$ is obtained by performing division into twenty of the inorganic polymer layer of a transmission electron microscope image obtained by photographing so that a gradation average value of a carbon deposition layer in a cross-sectional sample of the laminated film of a width of 90 nm, which was prepared by microsampling using a focused ion beam machining observation device, becomes 80 to 90 with a standard deviation of 3 to 5, so that divided ones have an equal film thickness in a film thickness direction, obtaining a standard deviation from a histogram when each cross section of $3^{rd}$ to $18^{th}$ divisions is gray scale-displayed at 256 gradations, and calculating a standard deviation ($\sigma$) as an average value thereof.
(b) An electron beam-irradiated part of the inorganic polymer layer is divided into twenty so that the divided ones have an equal film thickness in a film thickness direction, and a standard deviation of the contrast of each divided part ($\sigma n$: standard deviation of $n^{th}$ division, n=1~20) is calculated. A standard deviation $\sigma n$ is obtained by irradiating a cross-sectional sample of the laminated film having a width of 90 nm, which was prepared by microsampling using a focused ion beam machining observation device, with an electron beam at $1.30 \times 10^{16}$ ions/$cm^2$, and calculating a standard deviation from a histogram when a transmission electron microscope image obtained by photographing a cross section of each divided part of the inorganic polymer layer after electron irradiation under the same condition as that of a gradation average value of a carbon deposition layer set at (a) is gray scale-displayed at 256 gradations.
(c) Xn (n=1~20) of each divided part is calculated from the expression (1).

$$Xn = \sigma n / \sigma (n=1\sim20) \quad (1)$$

(d) A standard deviation of X3 to X18 is defined as Y.

By the Y value calculated by the analysis method, whether or not the cured state of the inorganic polymer layer in the laminated film is in the cured state where optimal water vapor transmission preventing performance can be obtained or not can be determined. When a value of the Y value is 0.220 or less, it can be determined that the cured state is the cured state where optimal water vapor transmission preventing performance can be obtained.

The present invention also provides a process for manufacturing a laminated film comprising at least a gas barrier layer and an inorganic polymer layer being laminated on a resin substrate, comprising a step of forming the gas barrier layer by chemical vapor deposition, wherein a Y value calculated from a transmission electron microscope image of a cross section of the inorganic polymer layer by the following procedures (a) to (d) is 0.220 or less.
(a) A standard deviation ($\sigma$) of the contrast of an electron beam-unirradiated part of the inorganic polymer layer is calculated. A standard deviation $\sigma$ is obtained by performing division into twenty of the inorganic polymer layer of a transmission electron microscope image obtained by photographing so that a gradation average value of a carbon deposition layer in a cross-sectional sample of the laminated film of a width of 90 nm, which was prepared by microsampling using a focused ion beam machining observation device, becomes 80 to 90 with a standard deviation of 3 to 5, so that divided ones have an equal film thickness in a film thickness direction, obtaining a standard deviation from a histogram when each cross section of $3^{rd}$ to $18^{th}$ divisions is gray scale-displayed at 256 gradations, and calculating a standard deviation ($\sigma$) as an average value thereof.
(b) An electron beam-irradiated part of the inorganic polymer layer is divided into twenty so that the divided ones have an equal film thickness in a film thickness direction, and a standard deviation of the contrast of each divided part ($\sigma n$: standard deviation of $n^{th}$ division, n=1~20) is calculated. A standard deviation σn is obtained by irradiating a cross-sectional sample of the laminated film having a width of 90 nm, which was prepared by microsampling using a focused ion beam machining observation device, with an electron beam at $1.30 \times 10^{16}$ ions/cm$^2$, and calculating a standard deviation from a histogram when a transmission electron microscope image obtained by photographing a cross section of each divided part of the inorganic polymer layer after electron irradiation under the same condition as that of a gradation average value of a carbon deposition layer set at (a) is gray scale-displayed at 256 gradations.
(c) Xn (n=1~20) of each divided part is calculated from the expression (1).

$$Xn=\sigma n/\sigma(n=1\sim20) \quad (1)$$

(d) A standard deviation of X3 to X18 is defined as Y.

Effect of the Invention

It is preferable that the manufacturing process has a step of forming the inorganic polymer layer by curing a composition containing an inorganic polymer by irradiation of vacuum ultraviolet light having the wavelength of 200 nm or less.

According to the present invention, there can be provided a laminated film which can prevent transmission of the water vapor at the higher level and a process for manufacturing it, as well as a method for analyzing a laminated film.

BRIEF DESCRIPTION OF THE DRAWINGS

FIG. 7 is a graph showing the result of XPS depth profile measurement of a gas barrier layer in a gas barriering laminated film of Example 4.

DETAILED DESCRIPTION OF THE PREFERRED EMBODIMENTS

Preferable embodiments of the present invention will be illustrated in detail below, while referring to the figures. In addition, in the following illustration and drawings, the same symbol is added to the same or equivalent part, and overlapped illustration will be omitted. Additionally, the dimensional ratio of the drawings is not limited to the illustrated ratio.
[Laminated Film]

Figure 1:
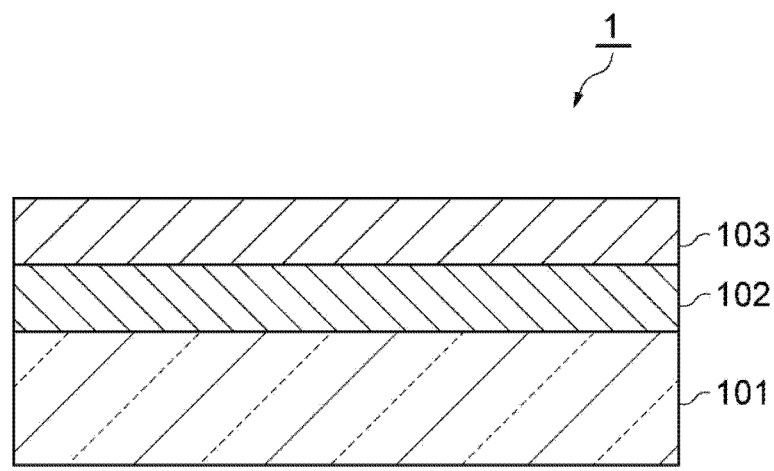
FIG. 1 is a schematic cross-sectional view showing one embodiment of a laminated film of the present invention.

FIG. 1 is a schematic cross-sectional view showing one embodiment of the laminated film of the present invention. As shown in FIG. 1, the laminated film (gas barriering laminated film) 1 of the present embodiment has a structure in which a gas barrier layer 102 and an inorganic polymer layer 103 are laminated on a resin substrate 101. In the laminated film 1, the inorganic polymer layer 103 is a layer in which a Y value calculated from a transmission electron microscope image of its cross section by the following procedures (a) to (d) is 0.220 or less.

(a) A standard deviation (σ) of the contrast of an electron beam-unirradiated part of the inorganic polymer layer is calculated. A standard deviation σ is obtained by performing division into twenty of the inorganic polymer layer of a transmission electron microscope image obtained by photographing so that a gradation average value of a carbon deposition layer in a cross-sectional sample of the laminated film of a width of 90 nm, which was prepared by microsampling using a focused ion beam machining observation device, becomes 80 to 90 with a standard deviation of 3 to 5, so that divided ones have an equal film thickness in a film thickness direction, obtaining a standard deviation from a histogram when each cross section of 3$^{rd}$ to 18$^{th}$ divisions is gray scale-displayed at 256 gradations, and calculating a standard deviation (σ) as an average value thereof.

(b) An electron beam-irradiated part of the inorganic polymer layer is divided into twenty so that the divided ones have an equal film thickness in a film thickness direction, and a standard deviation of the contrast of each divided part (σn: standard deviation of n$^{th}$ division, n=1~20) is calculated. A standard deviation σn is obtained by irradiating a cross-sectional sample of the laminated film having a width of 90 nm, which was prepared by microsampling using a focused ion beam machining observation device, with an electron beam at $1.30 \times 10^{16}$ ions/cm$^2$, and calculating a standard deviation from a histogram when a transmission electron microscope image obtained by photographing a cross section of each divided part of the inorganic polymer layer after electron irradiation under the same condition as that of a gradation average value of a carbon deposition layer set at (a) is gray scale-displayed at 256 gradations.

(c) Xn (n=1~20) of each divided part is calculated from the expression (1).

$$Xn=\sigma n/\sigma(n=1\sim20) \quad (1)$$

(d) A standard deviation of X3 to X18 is defined as Y.

Each layer of the laminated film will be illustrated in detail below.
(Resin Substrate 101)

The resin substrate 101 is not particularly limited, as far as it is formed of a resin (organic polymer material) which can hold the gas barrier layer 102 and the inorganic polymer layer 103. As the resin substrate 101, a resin film can be used, and it is preferable to use colorless transparent one. Examples of the resin constituting the resin substrate 101 include polyester resins such as polyethylene terephthalate (PET) and polyethylene naphthalate (PEN); polyolefin resins such as polyethylene (PE), polypropylene (PP), and cyclic polyolefin; polyamide resins; polycarbonate resins; polystyrene resins; polyvinyl alcohol resins; saponification products of an ethylene-vinyl acetate copolymer; polyacrylonitrile resins; acetal resins; polyimide resins; polyether sulfide (PES), and if necessary, two or more of them can also be used by combination. Among them, it is preferable that a resin selected from a polyester resin and a polyolefin resin is used, in conformity with necessary properties such as transparency, heat resistance, and linear expansion property, and it is more preferable that PET, PEN, and a cyclic polyolefin are used. Alternatively, as the resin substrate 101, a laminate obtained by laminating two or more layers of the resins can also be used.

The resin substrate 101 may be an unstretched resin substrate, or may be a stretched resin substrate obtained by stretching an unstretched resin substrate in a flow direction of a resin substrate (MD direction), and/or a direction orthogonal with a flow direction of a resin substrate (TD direction), by the known method such as monoaxial stretching, tenter sequential biaxial stretching, tenter simultaneous biaxial stretching, and tubular simultaneous biaxial stretching.

A thickness of the resin substrate 101 is appropriately set in view of stability and the like when the laminated film 1 is manufactured, and since conveyance of the resin substrate 101 is also easy in vacuum, a thickness is preferably 5 to 500 μm. Furthermore, when the gas barrier layer 102 is formed by an interroll discharge plasma CVD method described later, since discharge is performed through the resin substrate 101, a thickness of the resin substrate 101 is more preferably 50 to 200 μm, and further preferably 50 to 100 μm.

In addition, from a view point of adherability between the gas barrier layer 102, the resin substrate 101 may be subjected to surface activation treatment for cleaning a surface thereof. Examples of such surface activation treatment include corona treatment, plasma treatment, and flame treatment.

(Gas Barrier Layer 102)

The gas barrier layer 102 is a layer having such gas barrier property that transmission of the gas such as the water vapor is prevented. "Gas barrier property" mentioned herein may be such that at least one condition of the following conditions (A) to (C) is satisfied.

<Condition (A)>

When "the gas transmission rate of a resin substrate (unit: mol/m$^2$·s·P)" and "the gas transmission rate of a resin substrate on which a film of a gas barrier layer is formed (unit: mol/m$^2$·s·P)" measured by the method in accordance with JIS K 7126 (published in 2006) are compared, the "gas transmission rate of a resin substrate on which a film of a gas barrier layer is formed" shows a value which is smaller by 2 or more orders of magnitude (1/100 or less value) relative to the "gas transmission rate of a resin substrate".

<Condition (B)>

When "the water vapor transmission rate of a resin substrate (unit: g/m$^2$·s·P)" and "the water vapor transmission rate of a resin substrate on which a film of a gas barrier layer is formed (unit: g/m$^2$·s·P)" measured by a method in accordance with the method described in JIS K 7129 (published in 2008) are compared, the "water vapor transmission rate of a resin substrate on which a film of a gas barrier layer is formed" shows a value which is smaller by 2 or more orders of magnitude (1/100 or less value) relative to the "water vapor transmission rate of a resin substrate".

<Condition (C)>

When "the water vapor transmission rate of a resin substrate (unit: g/m$^2$·s·P)" and "the water vapor transmission rate of a resin substrate on which a film of a gas barrier layer is formed (unit: g/m$^2$·s·P)" measured by a method in accordance with the method described in JP-A-2005-283561 are compared, the "water vapor transmission rate of a resin substrate on which a film of a gas barrier layer is formed" shows a value which is smaller by 2 or more orders of magnitude (1/100 or less value) relative to the "water vapor transmission rate of a resin substrate".

In addition, since generally, the water vapor transmission rate of a substrate on which a film of a gas barrier layer having water vapor barrier property (gas barrier property) is formed, shows a value of $10^{-2}$ g/m$^2$/day or less, when the conditions (B) and (C) are studied, the "water vapor transmission rate of a resin substrate on which a film of a gas barrier layer is formed" is preferably a value of $10^{-2}$ g/m$^2$/day or less. As the gas barrier layer having such gas barrier property, one satisfying the condition (C) is more preferable.

A thickness of the gas barrier layer 102 is preferably in the range of 5 to 3000 nm, more preferably in the range of 10 to 2000 nm, further preferably in the range of 10 to 1000 nm, and particularly preferably in the range of 100 to 1000 nm. When a thickness of the gas barrier layer 102 is in the above-mentioned range, gas barrier property such as oxygen gas barrier property and water vapor gas barrier property tends to hardly reduce, and gas barrier property becomes to tend to hardly reduce by bending.

A kind of the gas barrier layer 102 is not particularly limited, but the known thin film layer having gas barrier property can be appropriately utilized, and a thin film layer containing at least one of a metal oxide, a metal nitride, a metal oxynitride and a metal oxycarbide is preferable. Alternatively, as the gas barrier layer 102, a multilayer film in which two or more thin film layers described above are laminated can also be used.

From a view point that higher water vapor transmission preventing performance can be exerted, as well as from a view point of flex resistance, easiness of manufacturing and the low manufacturing cost, the gas barrier layer 102 is more preferably a layer composed of a thin film containing at least a silicon atom and an oxygen atom. Furthermore, it is preferable that the layer composed of a thin film containing a silicon atom and an oxygen atom is a thin film layer using plasma chemical vapor deposition, or a thin film formation method of forming a precursor on a substrate surface, and performing plasma treatment.

Inter alia, it is particularly preferable that the gas barrier layer 102 is a silicon oxide-based thin film layer, which contains a silicon atom, an oxygen atom and a carbon atom, and satisfies all of the following conditions (i) to (iii), in a silicon distribution curve, an oxygen distribution curve and a carbon distribution curve, each showing a relationship between a distance from a surface of the gas barrier layer 102 (surface on a side opposite to the resin substrate 101, being an interface between the inorganic polymer layer 103) in a film thickness direction of the gas barrier layer 102, and the ratio of an amount of a silicon atom (atomic ratio of silicon), the ratio of an amount of an oxygen atom (atomic ratio of oxygen) or the ratio of an amount of a carbon atom (atomic ratio of carbon), to a total amount of a silicon atom, an oxygen atom and a carbon atom. (i) The atomic ratio of silicon, the atomic ratio of oxygen and the atomic ratio of carbon satisfy the expression (2):

$$\text{(Atomic ratio of oxygen)} > \text{(atomic ratio of silicon)} > \text{(atomic ratio of carbon)} \quad (2)$$

in a region of 90% or more of a film thickness of the gas barrier layer.

(ii) The carbon distribution curve has at least one extreme value.

(iii) An absolute value of a difference between a maximum value and a minimum value of the atomic ratio of carbon in the carbon distribution curve is 5 at % or more.

Such a silicon oxide-based thin film layer will be illustrated in more detail below.

In such a silicon oxide-based thin film layer, first, in a silicon distribution curve, an oxygen distribution curve and a carbon distribution curve, each showing a relationship between a distance from a surface of the layer in a film thickness direction of the layer, and the ratio of an amount of a silicon atom (atomic ratio of silicon), the ratio of an amount of an oxygen atom (atomic ratio of oxygen) and the ratio of an amount of a carbon atom (atomic ratio of carbon), to a total amount of a carbon atom, an oxygen atom and a carbon atom, (i) the atomic ratio of silicon, the atomic ratio of oxygen and the atomic ratio of carbon satisfy the condition represented by the expression (2):

(Atomic ratio of oxygen)>(atomic ratio of silicon)> (atomic ratio of carbon)     (2)

in a region of 90% or more (more preferably 95% or more, and further preferably 100%) of a film thickness of the layer. By the atomic ratio of silicon, the atomic ratio of oxygen and the atomic ratio of carbon satisfying the condition, gas barrier property of the gas barriering laminated film 1 becomes more excellent.

Additionally, it is necessary that such a silicon oxide-based thin film layer is such that (ii) the carbon distribution curve has at least one extreme value. In such a silicon oxide-based thin film layer, the carbon distribution curve has preferably at least two extreme values, and further preferably at least three extreme values. By the carbon distribution curve having an extreme value, reduction in gas barrier property when a film of the resulting gas barriering laminated film 1 is bent is suppressed. Additionally, when the carbon distribution curve has at least three extreme values, both of an absolute value of a difference in a distance from a surface of a silicon oxide-based thin film layer in a film thickness direction of the thin film layer at one extreme value possessed by the carbon distribution curve, and that at an extreme value adjacent to the extreme value are preferably 200 nm or less, and more preferably 100 nm or less. In addition, the "extreme value" mentioned herein refers to a local maximum value or a local minimum value of the atomic ratio of an element to a distance from a surface of a thin film layer in a film thickness direction of the thin film layer. Additionally, in the present specification, a local maximum value refers to a point at which a value of the atomic ratio of an element changes from increase to decrease when a distance from a surface of the thin film layer is changed, and in which a value of the atomic ratio of an element at a position at which a distance from a surface of the thin film layer in a film thickness direction of the thin film layer is further changed from the point by 20 nm is decreased than a value of the atomic ratio of an element at that point by 3 at % or more. Furthermore, in the present specification, the local minimum value is a point at which a value of the atomic ratio of an element is changed from decrease to increase when a distance from a surface of the thin film layer is changed, and in which a value of the atomic ratio of an element at a position at which a distance from a surface of the thin film layer in a film thickness direction of the thin film layer is further changed from the point by 20 nm is increased than a value of the atomic ratio of an element at that point by 3 at % or more.

Additionally, it is necessary that such a silicon oxide-based thin film layer is such that (iii) an absolute value of a difference between a maximum value and a minimum value of the atomic ratio of carbon in the carbon distribution curve is 5 at % or more. Additionally, in such a thin film layer, an absolute value of a difference between a maximum value and a minimum value of the atomic ratio of carbon is more preferably 6 at % or more, and further preferably 7 at % or more. When the absolute value is 5 at % or more, reduction in gas barrier property when a film of the resulting gas barriering laminated film 1 is bent is suppressed.

Additionally, in the silicon oxide-based thin film layer, the oxygen distribution curve has preferably at least one extreme value, more preferably at least two extreme values, and further preferably at least three extreme values. By the oxygen distribution curve having an extreme value, reduction in gas barrier property when a film of the resulting gas barriering laminated film 1 is bent is suppressed. Additionally, when the oxygen distribution curve has at least three extreme values like this, both of an absolute value of a difference in a distance from a silicon oxide-based thin film layer in a thickness direction of the thin film layer at one extreme value possessed by the oxygen distribution curve, and that at an extreme value adjacent to the extreme value are preferably 200 nm or less, and more preferably 100 nm or less.

Additionally, in the silicon oxide-based thin film layer, an absolute value of a difference between a maximum value and a minimum value of the atomic ratio of oxygen in the oxygen distribution curve of the layer is preferably 5 at % or more, more preferably 6 at % or more, and further preferably 7 at % or more. When the absolute value is not smaller than the above-mentioned lower limit, reduction in gas barrier property when a film of the resulting gas barriering laminated film 1 is bent is suppressed.

In the silicon oxide-based thin film layer, an absolute value of a difference between a maximum value and a minimum value of the atomic ratio of silicon in the silicon distribution curve of the layer is preferably less than 5 at %, more preferably less than 4 at %, and further preferably less than 3 at %. When the absolute value is not larger than the above-mentioned upper limit, gas barrier property of the resulting gas barriering laminated film 1 becomes more excellent.

Additionally, in the silicon oxide-based thin film layer, in the oxygen carbon distribution curve showing a relationship between a distance from a surface of the layer in a film thickness direction of the layer and the ratio of a total amount of an oxygen atom and a carbon atom to a total amount of a silicon atom, an oxygen atom and a carbon atom (atomic ratio of oxygen and carbon), an absolute value of a difference between a maximum value and a minimum value of a total of the atomic ratios of oxygen and carbon in the oxygen carbon distribution curve is preferably less than 5 at %, more preferably less than 4 at %, and further preferably less than 3 at %. When the absolute value is not larger than the above-mentioned upper limit, gas barrier property of the resulting gas barriering laminated film 1 becomes more excellent.

The silicon distribution curve, the oxygen distribution curve, the carbon distribution curve and the oxygen carbon distribution curve can be made by so-called XPS depth profile measurement, in which surface composition analysis is sequentially performed while the interior of a sample is exposed, by concurrently using measurement of X-ray Photoelectron Spectroscopy (XPS) and ion sputtering of a rare gas such as argon. A distribution curve obtained by such XPS depth profile measurement can be made, for example, with a vertical axis as the atomic ratio of each element (unit:at %) and with a horizontal axis as an etching time (sputtering time). In addition, in a distribution curve of an element with a horizontal axis as an etching time in this way, since the etching time is roughly correlated with a distance from a surface of the thin film layer in a film thickness direction of the thin film layer, as the "distance from a thin film layer in a film thickness direction of a thin film layer", a distance from a surface of a thin film layer which is calculated from a relationship between the etching rate and the etching time adopted upon XPS depth profile measurement can be adopted. Additionally, as a sputtering method which is adopted upon such XPS depth profile measurement, a rare gas ion sputtering method using argon (Ar$^+$) as an etching ion species is adopted, and it is preferable that the etching rate thereof is 0.05 nm/sec (SiO$_2$ thermally oxidized film reduced value).

Additionally, from a view point that the silicon oxide-based thin film layer which is uniform in an entire film surface and has excellent gas barrier property is formed, it is preferable that the layer is substantially uniform in a film surface direction (direction parallel with a surface of a thin film layer). In the present specification, that the silicon oxide-based thin film layer is substantially uniform in a film surface direction refers to that when the oxygen distribution curve, the carbon distribution curve and the oxygen carbon distribution curve are made by XPS depth profile measurement concerning arbitrary two measurement places of a film surface of a thin film layer, the numbers of extreme values possessed by the resulting carbon distribution curves obtained at arbitrary two measurement places are the same, and absolute values of differences between a maximum value and a minimum value of the atomic ratio of carbon in respective carbon distribution curves are the same, or have a difference within 5 at %.

Furthermore, in the silicon oxide-based thin film layer, it is preferable that the carbon distribution curve of the layer is substantially continuous. In the present specification, that the carbon distribution curve is substantially continuous means that the atomic ratio of carbon in the carbon distribution curve does not contain a portion in which the atomic ratio of carbon in the carbon distribution curve discontinuously changes, specifically, refers to the condition represented by the following mathematical expression (F1):

$$(dC/dx) \leq 0.5 \tag{F1}$$

is satisfied, in a relationship between a distance in a film thickness of at least one layer among the thin film layers from a surface of the layer (x, unit: nm) which is calculated from the etching rate and the etching time, and the atomic ratio of carbon (C, unit:at %).

Additionally, when the atomic ratio of silicon, the atomic ratio of oxygen and the atomic ratio of carbon satisfy the condition represented by the expression (1) in a region of 90% or more of a film thickness of the layer, in the silicon distribution curve, the oxygen distribution curve and the carbon distribution curve, the atomic ratio of the content of a silicon atom to a total amount of a silicon atom, an oxygen atom and a carbon atom in the layer is preferably 25 to 45 at %, and more preferably 30 to 40 at %. Additionally, the atomic ratio of the content of an oxygen atom to a total amount of a silicon atom, an oxygen atom and a carbon atom in the silicon oxide-based thin film layer is preferably 33 to 67 at %, and more preferably 45 to 67 at %. Furthermore, the atomic ratio of the content of a carbon atom to a total amount of a silicon atom, an oxygen atom and a carbon atom in the silicon oxide-based thin film layer is preferably 3 to 33 at %, and more preferably 3 to 25 at %.

A method of forming the gas barrier layer 102 is not particularly limited, but the known method which can form a film of the gas barrier layer 102 on the resin substrate 101 can be appropriately adopted, and from a view point of gas barrier property, it is preferable to adopt plasma chemical vapor deposition (plasma CVD). In addition, the plasma chemical vapor deposition may be plasma chemical vapor deposition of the Penning discharge plasma system.

Additionally, when plasma is generated in the plasma chemical vapor deposition, it is preferable that plasma discharge is generated in a space between a plurality of film-forming rolls, and it is more preferable that using one pair of film-forming rolls, the resin substrate 101 is arranged in each of the one pair of film-forming rolls, and electricity is discharged between the one pair of film-forming rolls to generate plasma. By using one pair of film-forming rolls, arranging the resin substrate 101 on the one pair of film-forming rolls, and discharging electricity between such one pair of film-forming rolls like this, while a surface part of the resin substrate 101 present on one film-forming roll is formed into a film at film formation, it becomes possible to form a surface part of the resin substrate 101 present on the other film-forming roll into a film at the same time, not only a thin film can be manufactured effectively, but also the film forming rate can be doubled, and moreover, since a film having the same structure can be formed into a film, it becomes possible to at least double an extreme value in the carbon distribution curve, and it becomes possible to effectively form a layer satisfying all of the conditions (i) to (iii).

Additionally, it is preferable to adopt the roll-to-roll system while plasma chemical vapor deposition is utilized, as a method of forming the gas barrier layer 102, from a viewpoint of productivity. Additionally, an apparatus which can be used when the laminated film 1 is manufactured by such plasma chemical vapor deposition is not particularly limited, but an apparatus provided with at least one pair of film-forming rolls and a plasma power source, and having a configuration that electricity can be discharged between the one pair of film-forming rolls is preferable, and for example, when a manufacturing apparatus shown in FIG. 4 described later is used, it also becomes possible to manufacture the layer by the roll-to-roll system while plasma chemical vapor deposition is utilized.

<Interroll Discharge Plasma CVD Method>

Figure 4:
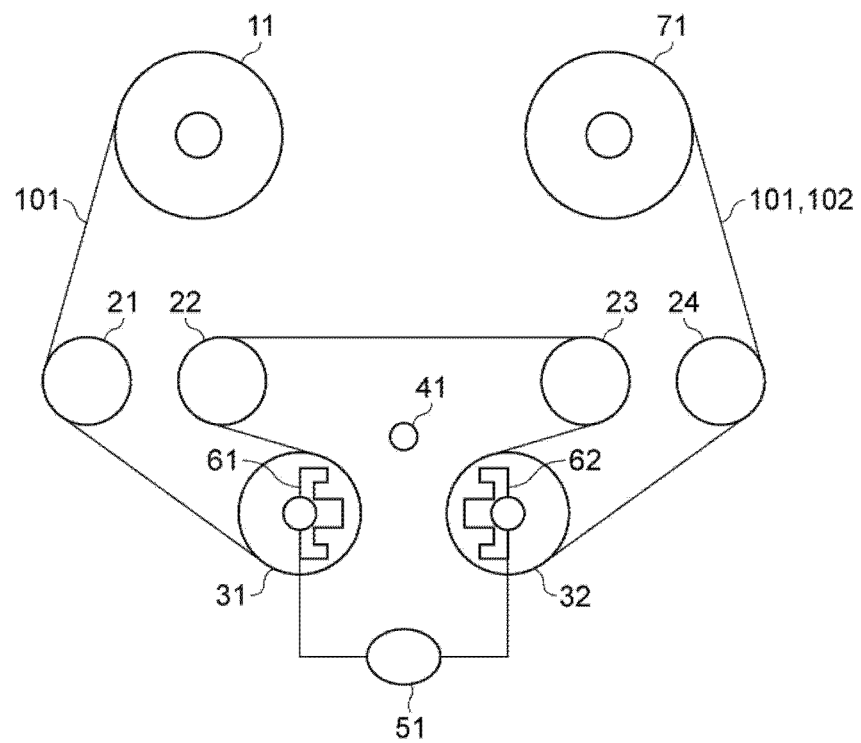
FIG. 4 is a schematic view showing one example of a suitable apparatus for forming a gas barrier layer by an interroll discharge plasma CVD method.

Herein, referring to FIG. 4, a method which can be suitably utilized for manufacturing a film member provided with a resin substrate 101 and a gas barrier layer 102 formed on at least one surface of the resin substrate 101, by forming a gas barrier layer 102 composed of the silicon oxide-based thin film on the resin substrate 101 will be illustrated. In addition, FIG. 4 is a schematic view showing one example of a manufacturing apparatus which can be suitably used for forming the gas barrier layer 102 on the resin substrate 101 by an interroll discharge plasma CVD method of generating plasma discharge between one pair of film-forming rolls.

The manufacturing apparatus shown in FIG. 4 is provided with a delivery roll 11, conveying rolls 21, 22, 23, 24, film-forming rolls 31, 32, a gas supply tube 41, a plasma generating power source 51, magnetic field generating devices 61, 62 mounted in the interior of the film-forming rolls 31 and 32, and a winding roll 71. Additionally, in such a manufacturing apparatus, at least the film-forming rolls 31, 32, the gas supply tube 41, the plasma generating power source 51, and the magnetic field generating devices 61, 62 are arranged in a vacuum chamber not shown. Furthermore, in such a manufacturing apparatus, the vacuum chamber is connected to a vacuum pump not shown, and the pressure in the vacuum chamber can be approximately adjusted by such a vacuum pump.

In such a manufacturing apparatus, each film-forming roll is connected to the plasma generating power source 51, respectively, so that it becomes possible to make one pair of film-forming rolls (film-forming roll 31 and film-forming roll 32) function as one pair of counter electrodes. For this reason, in such a manufacturing apparatus, by supplying electric power with the plasma generating power source 51, it is possible to discharge electricity in a space between the film-forming roll 31 and the film-forming roll 32, thereby, plasma can be generated in the space between the film-forming roll 31 and the film-forming roll 32. In addition, when the film-forming roll 31 and the film-forming roll 32 are also utilized as an electrode in this way, a material and design thereof may be appropriately changed so that they can also be utilized as an electrode. Additionally, in such a manufacturing apparatus, one pair of film-forming rolls (film-forming rolls 31 and 32) are preferably arranged so that central axes thereof become approximately parallel on the same plane. By arranging one pair of film-forming rolls (film-forming rolls 31 and 32) in this way, since the film forming rate can be doubled, and furthermore, a film having the same structure can be formed, it becomes possible to at least double an extreme value on the carbon distribution curve. And, according to such a manufacturing apparatus, since it is possible to form the gas barrier layer 102 on a surface of the resin substrate 101 by a CVD method, and further, film components can also be deposited on a surface of the resin substrate 101 also on the film-forming roll 32 while film components are deposited on a surface of the resin substrate 101 on the film-forming roll 31, the gas barrier layer 102 can be effectively formed on a surface of the resin substrate 101.

Additionally, in the interior of the film-forming roll 31 and the film-forming roll 32, there are provided magnetic field generating devices 61 and 62 which are fixed so as not to be rotated even when the film-forming rolls are rotated, respectively.

Furthermore, as the film-forming roll 31 and the film-forming roll 32, the known rolls can be appropriately used. From a view point that the gas barrier layer 102 is more effectively formed, it is preferable that, as such film-forming rolls 31 and 32, ones having the same diameter are used. Additionally, from a view point of the discharge condition, a space of a chamber and the like, it is preferable that a diameter of such film-forming rolls 31 and 32 is in the range of 5 to 100 cm.

Additionally, in such a manufacturing apparatus, the resin substrate 101 is arranged on one pair of film-forming rolls (film-forming roll 31 and film-forming roll 32) so that surfaces of the resin substrates 101 are opposed, respectively. By arranging the resin substrate 101 in this way, when electricity is discharged between the film-forming roll 31 and the film-forming roll 32 to generate plasma, it becomes possible to form a film on respective surfaces of the resin substrate 101 present between one pair of film-forming rolls simultaneously. That is, according to such a manufacturing apparatus, since, by CVD method, film components can be deposited on a surface of the resin substrate 101 on the film-forming roll 31, and further, film components can be deposited on the film-forming roll 32, it becomes possible to effectively form the gas barrier layer 102 on a surface of the resin substrate 101.

Additionally, as the delivery roll 11 and conveying rolls 21, 22, 23, 24 used in such a manufacturing apparatus, the known rolls can be appropriately used. Additionally, the winding roll 71 is not particularly limited, as far as it is a roll which can rewind the resin substrate 101 on which the gas barrier layer 102 is formed, but the known rolls can be appropriately used.

Additionally, as the gas supply tube 41, gas supply tubes which can supply or discharge a raw material gas and the like at a predetermined rate can be appropriately used. Furthermore, as the plasma generating power source 51, the known power sources of the plasma generating device can be appropriately used. Such a plasma generating power source 51 enables to supply electric power to the film-forming roll 31 and the film-forming roll 32 connected thereto, to utilize them as a counter electrode for discharge. Since it becomes possible to more effectively perform CVD, it is preferable to utilize a power source which can alternately invert polarity of the one pair of film-forming rolls (alternate current power source etc.) as such a plasma generating power source 51. Additionally, since it becomes possible to more effectively perform plasma CVD, a power source which can afford an application electric power of 100 W to 10 kW, and the frequency of an alternate current of 50 Hz to 500 kHz is more preferable as such a plasma generating power source 51. Additionally, as the electric field generating devices 61, 62, the known electric field generating devices can be appropriately used. Furthermore, as the resin substrate 101, in addition to the above-mentioned resin substrate 101, a resin substrate on which a thin film layer becoming a part of the gas barrier layer 102 has been formed in advance can be used. In this way, by using a resin substrate on which a thin film layer has been formed in advance, as the resin substrate 101, it is also possible to increase a thickness of the gas barrier layer 102.

By using such a manufacturing apparatus shown in FIG. 4 to appropriately adjust, for example, a kind of the raw material gas, electric power of an electrode drum of the plasma generating device, the pressure in the vacuum chamber, a diameter of the film-forming roll, as well as a conveying rate of the film, the gas barrier layer 102 composed of the silicon oxide-based thin film can be formed on a surface of the resin substrate 101. That is, by using a manufacturing apparatus shown in FIG. 4 to generate discharge between one pair of film-forming rolls (film-forming rolls 31 and 32) while a film-forming gas (raw material gas etc.) is supplied into the vacuum chamber, the film-forming gas (raw material gas etc.) is degraded with plasma, and the gas barrier layer 102 is formed by a plasma CVD method on a surface of the resin substrate 101 on the film-forming roll 31 and on a surface of the resin substrate 101 on the film-forming roll 32. In addition, upon such film formation, the resin substrate 101 is conveyed by the delivery roll 11, the film-forming roll 31 and the like, respectively, thereby, the gas barrier layer 102 composed of the silicon oxide-based thin film is formed on a surface of the resin substrate 101 by the roll-to-roll system continuous film-forming process.

As the raw material gas in the film-forming gas used in forming the gas barrier layer 102 composed of such a silicon oxide-based thin film, a raw material gas can be used by appropriately selecting it depending on a material of a thin film to be formed. As such a raw material gas, for example, an organosilicon compound containing silicon can be used. Examples of such an organosilicon compound include hexamethyldisiloxane, 1,1,3,3-tetramethyldisiloxane, vinyltrimethylsilane, methyltrimethylsilane, hexamethyldisilane, methylsilane, dimethylsilane, trimethylsilane, diethylsilane, propylsilane, phenylsilane, vinyltriethoxysilane, vinyltrimethoxysilane, tetramethoxysilane, tetraethoxysilane, phenyltrimethoxysilane, methyltriethoxysilane, and octamethylcyclotetrasiloxane. From a view point of handleability of a compound and properties such as gas barrier property of the resulting gas barrier layer 102, among these organosilicon compounds, hexamethyldisiloxane and 1,1,3,3-tetramethyldisiloxane are preferable. Additionally, these organosilicon compounds can be used alone, or can be used by combining two or more kinds.

Additionally, as the film-forming gas, in addition to the raw material gas, a reaction gas may be used. As such a reaction gas, the gas which reacts with the raw material gas to become an inorganic compound such as an oxide and a nitride can be appropriately selected and used. As the reaction gas for forming an oxide, for example, oxygen and ozone can be used. Additionally, as the reaction gas for forming a nitride, for example, nitrogen and ammonia can be used. These reaction gases can be used alone, or can be used by combining two or more kinds, and for example, when an oxynitride is formed, a reaction gas for forming an oxide and a reaction gas for forming a nitride can be used by combining them.

In the film-forming gas, in order to supply the raw material gas into the vacuum chamber, if necessary, a carrier gas may be used. Furthermore, in the film-forming gas, in order to generate plasma discharge, if necessary, the gas for discharge may be used. As such carrier gas and gas for discharge, the known ones can be appropriately used, and for example, a rare gas such as helium, argon, neon, and xenon; hydrogen can be used.

When such a film-forming gas contains the raw material gas and the reaction gas, as the ratio of the raw material gas and the reaction gas, it is preferable that the ratio of the reaction gas is not too more than the ratio of an amount of the reaction gas theoretically necessary for completely reacting the raw material gas and the reaction gas. When the ratio of the reaction gas is too excessive, it becomes impossible to obtain a thin film satisfying all of the conditions (i) to (iii). In this case, it becomes impossible to obtain excellent barrier property and flex resistance depending on a thin film layer to be formed. Additionally, when the film-forming gas contains the organosilicon compound and oxygen, it is preferable that the ratio is not greater than a theoretical oxygen amount necessary for completely oxidizing a total amount of the organosilicon compound in the film-forming gas.

By referring to an example when as the film-forming gas, a gas containing hexamethyldisiloxane (organosilicon compound: HMDSO: $(CH_3)_6Si_2O$) as a raw material gas and oxygen ($O_2$) as a reaction gas is used to manufacture a silicon-oxygen-based thin film, the preferable ratio of the raw material gas and the reaction gas in the film-forming gas and the like will be illustrated in more detail below.

When the film-forming gas containing hexamethyldisiloxane (HMDSO, $(CH_3)_6Si_2O$) as the raw material gas and oxygen ($O_2$) as the reaction gas is reacted by plasma CVD to form a silicon-oxygen-based thin film, by the film-forming gas, a reaction described in the following reaction formula (I):

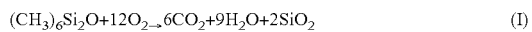

$$(CH_3)_6Si_2O + 12O_2 \rightarrow 6CO_2 + 9H_2O + 2SiO_2 \quad (I)$$

occurs, and silicon dioxide is produced. In such a reaction, an amount of oxygen necessary for completely oxidizing 1 mole of hexamethyldisiloxane is 12 moles. For this reason, when 12 moles or more of oxygen to 1 mole of hexamethyldisiloxane is contained in the filmmaking gas to completely react them, since a uniform silicon dioxide film is formed, it becomes impossible to form a thin film layer satisfying all of the conditions (i) to (iii). For this reason, when the gas barrier layer 102 composed of the silicon oxide-based thin film is formed, from a view point of that a thin film layer satisfying all of the conditions (i) to (iii) is formed, it is preferable that an amount of oxygen is less than 12 moles being the stoichiometric ratio to 1 mole of hexamethyldisiloxane, so that the reaction of the (I) formula does not completely progress. In addition, since in the actual reaction in a plasma CVD chamber, a film is formed by supplying hexamethyldisiloxane as a raw material and oxygen as a reaction gas to a film-forming region from a gas supply portion, even when a mole amount (flow rate) of oxygen as the reaction gas is a mole amount (flow rate) which is 12 times of a mole amount (flow rate) of hexamethyldisiloxane as the raw material, actually, the reaction cannot be completely progressed, and it is thought that when oxygen is supplied at the content which is largely excessive to the stoichiometric ratio, the reaction is first completed (For example, in order to obtain oxidized silicon by complete oxidation by CVD, a mole amount (flow rate) of oxygen is around 20 times or more of a mole amount (flow rate) of hexamethyldisiloxane as the raw material, in some cases). For this reason, it is preferable that a mole amount (flow rate) of oxygen to a mole amount (flow rate) of hexamethyldisiloxane as the raw material is an amount which is not greater than a 12-fold (more preferably, 10-fold or less) amount being the stoichiometric ratio. By containing hexamethyldisiloxane and oxygen at such a ratio, a carbon atom and a hydrogen atom in hexamethyldisiloxane which have not been completely oxidized are taken into a thin film layer, it becomes possible to forma thin film layer satisfying all of the conditions (i) to (iii), and it becomes possible to make the resulting laminated film 1 exert excellent barrier property and flex resistance. In addition, when a mole amount (flow rate) of oxygen to a mole amount (flow rate) of hexamethyldisiloxane in the film-forming gas is too small, since a carbon atom and a hydrogen atom which have not been oxidized are excessively taken into a thin film layer, in this case, transparency of the gas barrier layer 102 is deteriorated, and the laminated film 1 becomes to be hardly utilized in a flexible substrate for a device requiring transparency such as organic EL devices and organic thin film solar cells. From such a view point, a lower limit of a mole amount (flow rate) of oxygen to a mole amount (flow rate) of hexamethyldisiloxane in the film-forming gas is preferably an amount larger than 0.1 times, and more preferably an amount larger than 0.5 times of a mole amount (flow rate) of hexamethyldisiloxane.

Additionally, the pressure (vacuum degree) in the vacuum chamber can be appropriately adjusted depending on a kind of the raw material gas etc., and is preferably in the range of 0.5 Pa to 50 Pa.

Additionally, in such a plasma CVD method, electric power which is applied to an electrode drum (mounted in the film-forming rolls 31 and 32 in the present embodiment) connected to the plasma generating power source 51, in order to discharge electricity between the film-forming rolls 31 and 32, can be appropriately adjusted depending on a kind of the raw material gas and the pressure in the vacuum chamber, and cannot be said as a rule, but is preferably in the range of 0.1 to 10 kW. When such application electric power is in the above-mentioned range, particles tend to become difficult to be hardly generated, and a possibility that an amount of heat which is produced at film formation is increased, a temperature of a substrate surface of film formation is risen, the substrate is thermally defeated to generate crease at film formation, and fusion of the film with heat generates discharge of a large current between naked film-forming rolls to damage the film-forming rolls themselves is reduced.

The conveying rate (line rate) of the resin substrate 101 can be appropriately adjusted depending on a kind of the raw material gas and the pressure in the vacuum chamber, and is preferably in the range of 0.25 to 100 m/min, and more preferably in the range of 0.5 to 20 m/min. When the line rate is in the above-mentioned range, crease due to heat is hardly generated in the film, and a thickness of the formed gas barrier layer 102 tends to hardly reduce.

By doing this, the gas barrier layer 102 composed of a silicon oxide-based thin film can be formed on the resin substrate 101.

Additionally, it is also preferable that the gas barrier layer 102 contains a silicon atom, an oxygen atom and a nitrogen atom, and the gas barrier layer is a silicon oxide-based layer satisfying all of the following conditions (iv) and (v):
(iv) The gas barrier layer has a second thin film layer, a first thin film layer and a third thin film layer which have different oxygen content ratios, from a resin substrate 101 side, and an average composition of a silicon atom, an oxygen atom and a nitrogen atom of the first thin film layer is in the range of 10 at %≤Si≤40 at %, 5 at %≤O≤30 at %, 50 at %≤N≤80 at %.
(v) The elemental ratio of a nitrogen atom and a silicon atom of the second and third thin film layers is in the range of the expression (3).

$$N/Si \leq 0.2 \tag{3}$$

Such a silicon oxide-based thin film layer will be illustrated in more detail below.

The gas barrier layer 102 may contain silicon, oxygen, nitrogen, and hydrogen. In this case, it is preferable that the gas barrier layer contains a compound having the general formula of $SiO_\alpha N_\beta H_\gamma$ as a main component. In this general formula, $\alpha$ is selected from a positive number less than 1, $\beta$ is selected from a positive number less than 3, and $\gamma$ is selected from a positive number less than 10, respectively. One or more of $\alpha$, $\beta$ and $\gamma$ in the general formula may be a constant value, or may be changed in a thickness direction of the gas barrier layer. Furthermore, the gas barrier layer may contain an element other than silicon, oxygen, nitrogen, and hydrogen, for example, one or more of carbon, boron, aluminum, phosphorus, sulfur, fluorine and chlorine.

In the first thin film layer of the gas barrier layer, the average elemental ratio in a film thickness direction is preferably in the range of 10 at %≤Si≤40 at %, 5 at %≤O≤30 at %, as well as 50 at %≤N≤80 at %, more preferably in the range of 15 at %≤Si≤35 at %, 10 at %≤O≤25 at %, as well as 55 at %≤N≤75 at %.

From a view point of gas barrier property, it is preferable that as a method of forming the gas barrier layer 102, plasma chemical vapor deposition (PECVD method) is adopted. In addition, the plasma chemical vapor deposition may be plasma chemical vapor deposition of the Penning discharge plasma system.

From a view point of enhancing gas barrier property and transparency, a thickness of the gas barrier layer 102 is preferably 5 to 3000 nm, more preferably 10 to 2000 nm, and further preferably 100 to 1000 nm.

It is preferable that the gas barrier layer 102 has a second thin film layer, a first thin film layer, and a third thin film layer which have different oxygen content ratios from a resin substrate 101 side, from a view point of attaining both flexibility and gas barrier property.

It is preferable that the second and third thin film layers contain silicon and oxygen, and contain a compound represented by the general formula of $SiO_n$ as a main component. It is preferable that n is 1.5 to 3.0, and it is more preferably that n is 2.0 to 2.5. And, n may be a constant value, or may be changed in a thickness direction of the second and third thin film layers. It is preferable that the second and third thin film layers have the different constituted elemental ratio from that of the first thin film layer, and the elemental ratio of a nitrogen atom and a silicon atom of the second and third thin film layers is in the expression (3).

$$N/Si \leq 0.2 \tag{3}$$

In the second and third thin film layers, compositions of respective layers may be different or the same, and from a view point of stably forming the thin film layer, the layers have preferably substantially the same composition. Substantially the same composition refers to that the average elemental ratio of silicon and oxygen constituting the second thin film layer and the average elemental ratio of silicon and oxygen constituting the third thin film layer are in the range of ±5 at %.

From a view point of achieving both flexibility and gas barrier property, the second and third thin film layers have a film thickness of preferably 100 nm or less, more preferably 80 nm or less, and further preferably 50 nm or less, respectively.

From a view point of achieving both transparency and gas barrier property, in the gas barrier layer 102 (a layer of combination of second, first and third thin film layers), in infrared absorption spectrum obtained from infrared spectrometry, when the intensity ratio I'/I of the peak intensity (I) present at 810 to 880 cm$^{-1}$ and the peak intensity (I') present at 2100 to 2200 cm$^{-1}$ is obtained, the ratio is preferably in the range of the expression (4).

$$0.05 \leq I'/I \leq 0.20 \tag{4}$$

An absorption peak present at 810 to 880 cm$^{-1}$ is assigned to Si—N, and an absorption peak present at 2100 to 2200 cm$^{-1}$ is assigned to Si—H. That is, from a view point of enhancing gas barrier property, it is preferable that I'/I is 0.20 or less so that the gas barrier layer becomes to have a denser structure, and from a view point of enhancing transparency, it is preferable that I'/I is 0.05 or more so that light transmission in a visible region is not reduced.

<Inductively Coupled Plasma CVD Method>

Examples of a method of forming such a gas barrier layer 102 include a formation method by an inductively coupled plasma CVD method. The inductively coupled plasma CVD method is a procedure of forming the induction electric field by applying high frequency electric power to an induction coil to generate plasma. Since generated plasma is high density and low temperature plasma, and is stable glow discharge plasma, particularly when the resin substrate 101 having low heat resistance is used, the plasma is suitable for forming a thin film of the dense gas barrier layer 102 on the resin substrate 101.

Figure 5:
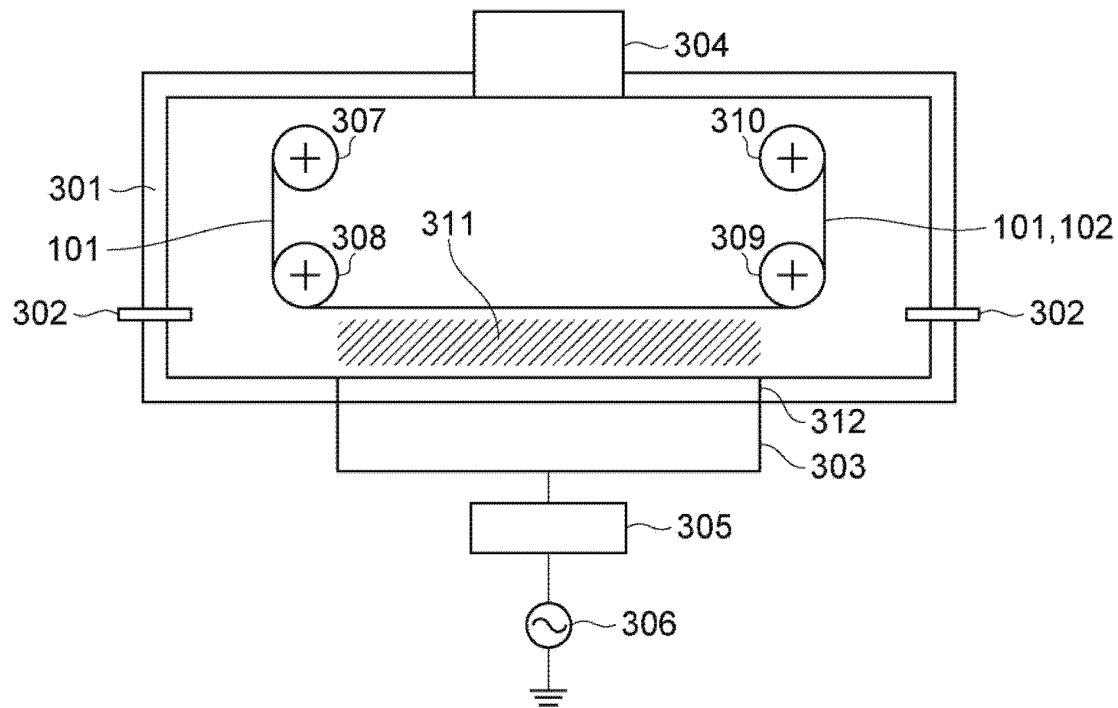
FIG. 5 is a schematic view showing one example of a suitable apparatus for forming a gas barrier layer by an inductively coupled plasma CVD method.

The gas barrier layer 102 is formed by applying high frequency electric power to an induction coil using a general inductively coupled plasma CVD apparatus, thereby, forming the induction electric field, introducing a raw material gas to generate plasma, and forming a thin film on the resin substrate 101 (e.g. see JP-A-2006-164543). FIG. 5 is a schematic view showing one example of a suitable device for forming a gas barrier layer by an inductively coupled PECVD method. As shown in FIG. 5, a delivery roll 307, a winding roll 310 and conveying rolls 308, 309 are arranged in a vacuum chamber 301, and the resin substrate 101 is continuously conveyed. In addition, the delivery roll 307 and the winding roll 310 can also be inverted depending on the situation, the delivery roll can be appropriately changed to the winding roll, and the winding roll can be appropriately changed to the delivery roll. Additionally, in the vacuum chamber 301, an induction coil 303 for generating the magnetic field is provided via a rectangular inductor window 312 composed of aluminum oxide or the like, below a film formation portion (film-forming zone) 311 at which the gas barrier layer 102 is formed on the resin substrate 101, and further, a gas introduction piping 302 for introducing the gas and a vacuum pump 304 for discharging an extra gas are provided. In addition, a baffle plate for uniformizing the gas may be provided in the vicinity of a portion at which introduction and discharge of the gas are performed. Additionally, the induction coil 303 is connected to a high frequency power source 306 via a matching box 305.

The gas barrier layer 102 can be made by supplying a raw material gas though the gas introduction piping 302 using this inductively coupled plasma CVD apparatus while the resin substrate 101 is conveyed at the constant rate, generating plasma with the induction coil 303 at the film-forming portion 311, and forming a thin film layer obtained by degrading and recombining the raw material gas on the resin substrate 101.

Upon formation of the gas barrier layer 102, the resin substrate 101 is conveyed so that a conveyance direction of the resin substrate 101 is parallel with one of opposite two sides of the rectangular inductor window 312 arranged at a lower portion of the film-forming portion 311, and becomes a direction vertical to remaining opposite two sides. Thereby, upon passage through the film-forming portion 311, immediately above opposite two sides of the inductor window in a direction vertical to a conveying direction of the resin substrate 101, the plasma density is decreased, and associated therewith, a thin film layer composition after degradation and recombination of the raw material gas is changed.

The gas barrier layer 102 can be formed by using an inorganic silane-based gas, an ammonia gas, an oxygen gas and an inert gas as the raw material gas. Additionally, the gas barrier layer 102 is formed by flowing the raw material gas at a flow rate and the flow rate ratio within the range used in the normal inductively coupled plasma CVD method, respectively.

Examples of the inorganic silane-based gas include a hydrogenated silane gas and a halogenated silane gas such as a monosilane gas, a disilane gas, a trisilane gas, a dichlorosilane gas, a trichlorosilane gas, and a tetrachlorosilane gas. Among these inorganic silane-based gases, a monosilane gas and a disilane gas are preferable, from a view point of handleability of a compound and compactness of the resulting thin film layer. Additionally, these inorganic silane-based gases can be used alone, or can be used by combining two or more kinds. Examples of the inert gas include a nitrogen gas, an argon gas, a neon gas, a xenon gas and the like.

Electric power to be supplied to an electrode can be appropriately adjusted depending on a kind of the raw material gas and the pressure in the vacuum chamber 301, and for example, is set at 0.1 to 10 kW, and the frequency of an alternate current is set, for example, at 50 Hz to 100 MHz. By electric power being 0.1 kW or more, the effect of suppressing generation of particles becomes high. Additionally, by electric power being 10 kW or less, the effect of suppressing crease or damage from being generated in the resin substrate 101 due to heat received from an electrode becomes high. Furthermore, from a view point of increasing the degradation efficiency of the raw material gas, the alternate current frequency set at 1 MHz to 100 MHz may be used.

The pressure (vacuum degree) in the vacuum chamber 301 can be appropriately adjusted depending on a kind of the raw material gas and the like, and can be set, for example, at 0.1 Pa to 50 Pa.

The conveying rate of the resin substrate 101 can be appropriately adjusted depending on a kind of the raw material gas and the pressure in the vacuum chamber 301, and is preferably the same as the conveying rate of the resin substrate 101 when the resin substrate 101 is contacted with the conveying roll.

It is preferable that the gas barrier layer 102 is formed by a continuous film-forming process, and it is more preferable that while the long resin substrate 101 is continuously conveyed, the gas barrier layer 102 is continuously formed thereon.

The gas barrier layer 102 can be further formed from an upper side, by forming the resin substrate 101 while it is conveyed to the winding roll 310 from the delivery roll 307, thereafter, inverting the delivery roll 307 and the winding roll 310, and conveying the resin substrate 101 in a reverse direction. Formation can be appropriately changed depending on the desired lamination number, a film thickness, and the conveying rate.

(Inorganic Polymer Layer 103)

The inorganic polymer layer 103 is a layer which is formed using an inorganic polymer. The inorganic polymer is not particularly limited as far as a coating liquid containing the inorganic polymer can be prepared, and for example, a silicon compound is exemplified. Specific examples of the silicon compound include perhydropolysilazane, organopolysilazane, silsesquioxane, tetramethylsilane, trimethylmethoxysilane, dimethyldimethoxysilane, methyltrimethoxysilane, trimethylethoxysilane, dimethyldiethoxysilane, methyltriethoxysilane, tetramethoxysilane, tetramethoxysilane, hexamethyldisiloxane, hexamethyldisilazane, 1,1-dimethyl-1-silacyclobutane, trimethylvinylsilane, methoxydimethylvinylsilane, trimethoxyvinylsilane, ethyltrimethoxysilane, dimethyldivinylsilane, dimethylethoxyethynylsilane, diacetoxydimethylsilane, dimethoxymethyl-3,3,3-trifluoropropylsilane, 3,3,3-trifluoropropyltrimethoxysilane, aryltrimethoxysilane, ethoxydimethylvinylsilane, arylaminotrimethoxysilane, N-methyl-N-trimethylsilylacetamide, 3-aminopropyltrimethoxysilane, methyltrivinylsilane, diacetoxymethylvinylsilane, methyltriacetoxysilane, aryloxydimethylvinylsilane, diethylvinylsilane, butyltrimethoxysilane, 3-aminopropyldimethylethoxysilane, tetravinylsilane, triacetoxyvinylsilane, tetraacetoxysilane, 3-trifluoroacetoxypropyltrimethoxysilane, diaryldimethoxysilane, butyldimethoxyvinylsilane, trimethyl-3-vinylthiopropylsilane, phenyltrimethylsilane, dimethoxymethylphenylsilane, phenyltrimethoxysilane, 3-acryloxypropyldimethoxymethylsilane, 3-acryloxypropyltrimethoxysilane, dimethylisopentyloxyvinylsilane, 2-aryloxyethylthiomethoxytrimethylsilane, 3-glycidoxypropyltrimethoxysilane, 3-arylaminopropyltrimethoxysilane, hexyltrimethoxysilane, heptadecafluorodecyltrimethoxysilane, dimethylethoxyphenylsilane, benzoyloxytrimethylsilane, 3-methacyloxypropyldimethoxymethylsilane, 3-methyacyloxypropyltrimethoxysilane, 3-isocyanatopropyltriethoxysilane, dimethylethoxy-3-glycidoxypropylsilane, dibutoxydimethylsilane, 3-butylaminopropyltrimethylsilane, 3-dimethylaminopropyldiethoxymethylsilane, 2-(2-aminoethylthioethyl)triethoxysilane, bis(butylamino)dimethylsilane, divinylmethylphenylsilane, diacetoxymethylphenylsilane, dimethyl-p-tolylvinylsilane, p-styryltrimethoxysilane, diethylmethylphenylsilane, benzyldimethylethoxysilane, diethoxymethylphenylsilane, decylmethyldimethoxysilane, diethoxy-3-glycidoxypropylmethylsilane, octyloxytrimethylsilane, phenyltrivinylsilane, tetraaryloxysilane, dodecyltrimethylsilane, diarylmethylphenylsilane, diphenylmethylvinylsilane, diphenylethoxymethylsilane, diacetoxydiphenylsilane, dibenzyldimethylsilane, diaryldiphenylsilane, octadecyltrimethylsilane, methyloctadecyldimethylsilane, docosylmethyldimethylsilane, 1,3-divinyl-1,1,3,3-tetramethyldisiloxane, 1,3-divinyl-1,1,3,3-tetramethyldisilazane, 1,4-bis(dimethylvinylsilyl)benzene, 1,3-bis(3-acetoxypropyl)tetramethyldisiloxane, 1,3,5-trimethyl-1,3,5-trivinylcyclotrisiloxane, 1,3,5-tris(3,3,3-trifluoropropyl)-1,3,5-trimethylcyclotrisiloxane, octamethylcyclotetrasiloxane, 1,3,5,7-tetraethoxy-1,3,5,7-tetramethylcyclotetrasiloxane, decamethylcyclopentasiloxane and the like. These silicon compounds can be used alone, or can also be used by combining two or more kinds.

The laminated film 1 in which such an inorganic polymer layer 103 is formed on the gas barrier layer 102 can prevent transmission of the water vapor at the higher level, and at the same time, can afford good flex resistance. This is because by protection of a surface of the gas barrier layer 102 by the inorganic polymer layer 103, a defect such as a crack or a via hole present in the gas barrier layer 102 can be made up for. From a view point of more sufficiently obtaining the above-mentioned effect, it is more preferable that the inorganic polymer layer 103 is a layer composed of a curing product of a composition containing polysilazane.

The inorganic polymer layer 103 is a laminated film characterized in that a Y value which is calculated by transmission electron microscope observation of its cross section by the following procedures (a) to (d) is 0.220 or less.

(a) A standard deviation (σ) of the contrast of an electron beam-unirradiated part of the inorganic polymer layer is calculated. A standard deviation σ is obtained by performing division into twenty of the inorganic polymer layer of a transmission electron microscope image obtained by photographing so that a gradation average value of a carbon deposition layer in a cross-sectional sample of the laminated film of a width of 90 nm, which was prepared by microsampling using a focused ion beam machining observation device, becomes 80 to 90 with a standard deviation of 3 to 5, so that divided ones have an equal film thickness in a film thickness direction, obtaining a standard deviation from a histogram when each cross section of $3^{rd}$ to $18^{th}$ divisions is gray scale-displayed at 256 gradations, and calculating a standard deviation (σ) as an average value thereof.

(b) An electron beam-irradiated part of the inorganic polymer layer is divided into twenty so that the divided ones have an equal film thickness in a film thickness direction, and a standard deviation of the contrast of each divided part (σn: standard deviation of $n^{th}$ division, n=1~20) is calculated. A standard deviation σn is obtained by irradiating a cross-sectional sample of the laminated film having a width of 90 nm, which was prepared by microsampling using a focused ion beam machining observation device, with an electron beam at $1.30 \times 10^{16}$ ions/cm$^2$, and calculating a standard deviation from a histogram when a transmission electron microscope image obtained by photographing a cross section of each divided part of the inorganic polymer layer after electron irradiation under the same condition as that of a gradation average value of a carbon deposition layer set at (a) is gray scale-displayed at 256 gradations.

(c) Xn (n=1~20) of each divided part is calculated from the expression (1).

$$Xn = \sigma n / \sigma (n=1\sim20) \quad (1)$$

(d) A standard deviation of X3 to X18 is defined as Y.

The Y value is 0.220 or less, preferably 0.200 or less, and more preferably 0.180 or less. When the Y value is 0.220 or less in a cross section in the inorganic polymer layer 103, a region in the sufficiently cured state becomes to sufficiently exist in the inorganic polymer layer 103, and it becomes possible to effectively make up for a defect such as a crack or a via hole present in the gas barrier layer 102, to stably prevent transmission of the water vapor at the higher level. On the other hand, the Y value is preferably 0.010 or more, and more preferably 0.015 or more. When the Y value is 0.010 or more, a crack due to excessive curing is not generated, and the inorganic polymer layer 103 excellent in flex resistance can be obtained.

The Y value can be obtained, for example, by the following method. First, using a vacuum deposition device, aluminum is deposited on the inorganic polymer layer at a thickness of 50 nm. Then, using a focused ion beam (FIB) machining observation device, carbon is deposited on the aluminum at 300 nm by a deposition method, and a cross-sectional sample of the laminated film having a width of 90 nm and a length of 10 μm is prepared by microsampling, at the condition under which damage due to FIB machining does not enter a sample piece. Observation of a cross section of the resulting sample is performed by observing a bright field image using TEM (transmission electron microscope). TEM observation is performed so that a region containing a central part of the carbon deposition layer and the inorganic polymer layer 103 has resolution of 512×512 pixel or more, at the condition under which a gradation average value of a central part of the carbon layer which was deposited upon the FIB machining becomes 80 to 90 with a standard deviation of 3 to 5. Irradiation of the resulting sample with an electron beam is performed under the condition of an electron beam irradiation amount of $1.30 \times 10^{16}$ ions/cm$^2$, so that the entire inorganic polymer layer in a film thickness direction is irradiated with an electron beam using ASID mode of EF-TEM. The inorganic layer is divided into twenty so that the divided ones have an equal film thickness in a film thickness direction when a TEM observation image obtained by measuring the inorganic polymer layer in a region in the cross sectional sample where electron beam irradiation has not been performed, at the condition under which a gradation average value of a central part of the carbon layer which has been deposited upon the FIB machining becomes 80 to 90 with a standard deviation of 3 to 5, is gray scale-displayed at 256 gradations using photo editor software, a standard deviation of a histogram of each cross section of $3^{rd}$ to $18^{th}$ divisions is obtained, and an average value thereof is adopted as a standard deviation σ. Then, concerning a TEM observation image obtained by measuring the inorganic polymer layer in a region in the cross-sectional sample where electron beam irradiation has been performed under the same condition as that of a gradation average value of the carbon deposition layer which was set when the inorganic polymer layer of an electron beam-unirradiated part was measured, the inorganic polymer layer 103 is divided into twenty equally in a film thickness direction, a standard deviation of a histogram when the resulting twenty respective layers are gray scale-displayed at 256 gradations using photo editor software is obtained, and a standard deviation of the contrast of each divided part (σn: standard deviation of $n^{th}$ division, n=1~20) is calculated. Xn (n=1~20) of each divided part is calculated from the expression (1).

$$Xn = \sigma n / \sigma (n=1\sim20) \quad (1)$$

The resulting standard deviation of X3 to X18 is defined as Y. When a Y value is 0.220 or less, it becomes possible to effectively make up for a defect such as a crack or a via hole present in the gas barrier layer 102, to stably prevent transmission of the water vapor at the higher level.

From a view point that variation due to damage by electron beam irradiation is reduced, an irradiation amount of an electron beam which is irradiated in an entire film thickness direction of the inorganic polymer layer by EF-TEM is preferably $1.00 \times 10^{16}$ ions/cm$^2$ or more from a view point that variation of data due to too small damage is reduced, and preferably $1.60 \times 10^{16}$ ions/cm$^2$ or less from a view point that variation of data due to too large damage is reduced. From them, an electron beam irradiation amount can be set at a specific value, and for example, an electron beam irradiation amount can be set at $1.30 \times 10^{16}$ ions/cm$^2$.

A thickness of the inorganic polymer layer 103 is preferably in the range of 5 to 3000 nm, more preferably in the range of 10 to 2000 nm, further preferably in the range of 10 to 1000 nm, and particularly preferably in the range of 20 to 1000 nm. When a thickness of the inorganic polymer layer 103 is in the above-mentioned range, water vapor transmission preventability tends to hardly reduce, and flexibility tends to hardly reduce.

The inorganic polymer layer 103 can be formed by coating a coating liquid containing the inorganic polymer such as polysilazane on the gas barrier layer 102, drying it, and curing-treating a formed coated film. As the coating liquid, a liquid obtained by dissolving or dispersing the inorganic polymer in a solvent can be used. The concentration of the inorganic polymer in the coating liquid may be appropriately adjusted depending on a thickness of the inorganic polymer layer 103 and requirement from a pot life of the coating liquid, and is usually 0.2 to 35% by mass.

Specific examples of polysilazane being the inorganic polymer include perhydropolysilazane (PHPS) and the like.

As the solvent, a solvent which is not reacted with the inorganic polymer to be used, is suitable for dissolving or dispersing the inorganic polymer, and has no adverse influence on the gas barrier layer 102 can be appropriately selected and used. Examples of the solvent include hydrocarbon solvents such as an aliphatic hydrocarbon, an alicyclic hydrocarbon, and an aromatic hydrocarbon, a halogenated hydrocarbon solvent, ethers such as aliphatic ether, and alicyclic ether. Examples of the solvent include more specifically hydrocarbons such as pentane, hexane, cyclohexane, toluene, and xylene, halogenated hydrocarbons such as methylene chloride, and trichloroethane, and ethers such as dibutyl ether, dioxane, and tetrahydrofuran. These solvents may be used by mixing two or more kinds.

When polysilazane is used as the inorganic polymer, in order to promote modification to silicon oxynitride, an amine catalyst, or a metal catalyst such as a Pt compound such as Pt acetylacetonate, a Pd compound such as Pd propionate, and a Rh compound such as Rh acetylacetonate can also be added to the coating liquid.

An addition amount of the catalyst to polysilazane is preferably 0.1 to 10% by mass, more preferably 0.2 to 5% by mass, and further preferably 0.5 to 2% by mass based on a total amount of the coating liquid. By an addition amount of the catalyst being in the above-mentioned range, excessive silanol formation, reduction in the film density, increase in a film defect due to rapid progression of the reaction and the like can be suppressed.

Examples of a method of coating the coating liquid on the gas barrier layer 102 include a spin coating method, a roller coating method, a flow coating method, an ink jet method, a spray coating method, a printing method, a dip coating method, a flow casting film-forming method, a bar coating method, a gravure printing method and the like.

Drying may be performed at the condition under which a solvent in the coating liquid can be removed. Alternatively, for example, coating and drying of the coating liquid on a heated hot plate may be performed simultaneously.

As a method of curing-treating the formed coated film, for example, a method which can cure the inorganic polymer in the coated film such as a plasma CVD method, an ion injection treating method, an ultraviolet irradiation method, a vacuum ultraviolet irradiation method, an oxygen plasma irradiation method, and a heat-treating method can be used. Among them, it is preferable to use a method of irradiating vacuum ultraviolet light (VUV light) having the wavelength of 200 nm or less to the coated film as the curing-treating method. Additionally, a method of irradiating vacuum ultraviolet light to the coated film is more preferable when polysilazane is used as the inorganic polymer.

In the case where a vacuum ultraviolet irradiation method is used as a method of curing-treating the coated film containing polysilazane, when the coated film is irradiated with vacuum ultraviolet ray, at least a part of polysilazane is modified to silicon oxynitride represented by $SiO_xN_y$. Herein, when perhydropolysilazane having a structure represented by $—(SiH_2—NH—)_n—$ is used as polysilazane, in order to be x>0 upon modification to $SiO_xN_y$, an oxygen source becomes necessary, and oxygen and moisture which were taken into the coated film in a manufacturing process become an oxygen source.

In the composition of $SiO_xN_y$, from a relationship of atomic bonding of Si, O, N, fundamentally, x and y become within the range of 2x+3y=4. In the state of y=0 at which oxidation has completely progressed, a silanol group becomes to be contained in the coated film, and x becomes within the range of 2<x<2.5 in some cases. In addition, since it is usually unlikely that nitration of Si progresses more than oxidation of Si, y is fundamentally 1 or less.

By irradiation with vacuum ultraviolet ray, silicon oxynitride is generated from perhydropolysilazane, and further, the reaction mechanism for generating silicon oxide is thought as follows:

(1) Dehydrogenation, and Formation of Si—N Bond Associated Therewith

It is thought that a Si—H bond and a N—H bond in perhydropolysilazane are relatively easily cut by excitation with vacuum ultraviolet irradiation, and are recombined as Si—N under the inert atmosphere (dangling bond of Si is formed in some cases). That is, perhydropolysilazane is cured as the $SiN_y$ composition without being oxidized. In this case, cutting of a polymer main chain is not generated. Cutting of a Si—H bond and a N—H bond is promoted by the presence of a catalyst or heating. Cut H is released to the outside of a film as $H_2$.

(2) Formation of Si—O—Si Bond by Hydrolysis and Dehydration Condensation

A Si—N bond in perhydropolysilazane is hydrolyzed with water, and a polymer main chain is cut to form Si—OH. Two Si—OHs are dehydration condensed to form a Si—O—Si bond and cured. This is a reaction which is also generated in the atmospheric air, and during vacuum ultraviolet irradiation under the inert atmosphere, it is thought that the water vapor which is generated from the resin substrate as outgas due to heat of irradiation becomes a main moisture source. When moisture becomes excessive, Si—OH which is not completely dehydration-condensed remains, and becomes a cured film having low gas barrier property, which is shown by the composition of $SiO_{2.1}$~$SiO_{2.3}$.

(3) Direct Oxidation Due to Singlet Oxygen, Formation of Si—O—Si Bond

When a suitable amount of oxygen exists under the atmosphere during vacuum ultraviolet irradiation, singlet oxygen having very strong oxidizing power is formed. H and N in perhydropolysilazane are substituted with O to form a Si—O—Si bond, and a product is cured. It is thought that recombination of a bond is generated by cutting of a polymer main chain, in some cases.

(4) Oxidation Associated with Si—N Bond Cutting by Vacuum Ultraviolet Irradiation and Excitation Since the energy of vacuum ultraviolet ray is higher than the binding energy of Si—N in perhydropolysilazane, a Si—N bond is cut, and when an oxygen source such as oxygen, ozone and water exists in its surroundings, it is thought that oxidation generates a Si—O—Si bond or a Si—O—N bond. It is thought that by cutting of a polymer main chain, recombination of a bond is generated in some cases.

Adjustment of the composition of silicon oxynitride of a layer which is obtained by subjecting the coated film containing polysilazane to vacuum ultraviolet irradiation can be performed by controlling the oxidized state by appropriately combining the oxidation mechanisms of the (1) to (4).

In vacuum ultraviolet irradiation, illuminance of vacuum ultraviolet ray on the coated film surface which is received by the coated film containing polysilazane is preferably in the range of 1 to 100000 mW/cm$^2$, and more preferably in the range of 30 to 200 mW/cm$^2$. When this illuminance is in the above-mentioned range, there is no fear of reduction in the modification efficiency, and ablation is not generated in the coated film, and damage is not given to the resin substrate 101, and accordingly, this is preferable.

In vacuum ultraviolet irradiation, an integrated light amount (integrated irradiation energy amount) of vacuum ultraviolet ray which is irradiated to the coated film containing polysilazane is preferably in the range of 1.0 to 100 mJ/cm$^2$/nm, more preferably in the range of 1.5 to 30 mJ/cm$^2$/nm, further preferably in the range of 2.0 to 20 mJ/cm$^2$/nm, and particularly preferably in the range of 5.0 to 20 mJ/cm$^2$/nm in the following expression which was standardized with a film thickness of the inorganic polymer layer. When this standardized integrated light amount is in the above-mentioned range, modification can be sufficiently performed, and at the same time, the Y value in the resulting inorganic polymer layer 103 can be reduced, additionally, the modification condition does not become the excessive modification condition, and there is a tendency that generation of a crack in the inorganic polymer layer 103 and thermal deformation of the resin substrate 101 can be prevented, and accordingly, this is preferable. When upon preparation into a desired film thickness, the inorganic polymer layer 103 is cured plural times, it is preferable that each layer has the above-mentioned range of the standardized integrated light amount.

$$\text{Standardized integrated light amount (mJ/cm}^2/\text{nm)} = \frac{\text{Integrated light amount (mJ/cm}^2)}{\text{Film thickness after drying of inorganic polymer layer (nm)}} \quad \text{[Mathematic 1]}$$

As a vacuum ultraviolet light source, a rare gas excimer lamp is preferably used. Since an atom of a rare gas such as Xe, Kr, Ar and Ne does not chemically bind to make a molecule, it is called inert gas.

However, an excited atom of a rare gas having obtained the energy by discharge or the like can bind with other atom to make a molecule. When the rare gas is xenon,

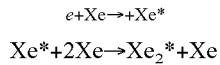

Xe*+2Xe→Xe$_2$*+Xe

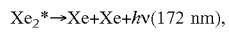

and when Xe$_2$* being an excited excimer molecule is transitioned to the ground state, it emits excimer light at the wavelength of 172 nm.

Examples of the characteristic of the excimer lamp include that since radiation is concentrated on the one wavelength, and little other than necessary light is radiated, the efficiency is high. Additionally, since extra light is not radiated, a temperature of a subject can be kept low. Furthermore, since start and restart do not need the time, instantaneous switching on and switching off are possible.

In order to obtain excimer light, a method of using inductor barrier discharge is known. Inductor barrier discharge is discharge called micro discharge, which is generated in a gas space by disposing the gas space between both electrodes through an inductor such as transparent quartz, and applying high frequency high voltage of a few tens kHz to an electrode, and is very thin similar to thunder, and since when a streamer of micro discharge arrives at a tube wall (inductor), charge is accumulated on an inductor surface, micro discharge disappeared.

Inductor barrier discharge is discharge in which this micro discharge is expanded on an entire tube wall, and generation and disappearance are repeated. For this reason, flickering of light which can also be confirmed with naked eyes is generated. Additionally, since a streamer at a very high temperature locally arrives at a tube wall directly, there is also a possibility that deterioration in a tube wall is accelerated.

As a method of effectively obtaining excimer light emission, in addition to inductor barrier discharge, electrodeless field discharge is also possible. This is electrodeless field discharge due to capacitive coupling, and is also called RF discharge, as another name. The lamp and the electrode and arrangement thereof may be fundamentally the same as those of inductor barrier discharge, but the high frequency wave which is applied between both electrodes is switched on at a few MHz. Since electrodeless field discharge can afford spatially or temporarily uniform discharge like this, the lamp of a long life having no flickering is obtained.

In the case of inductor barrier discharge, since micro discharge is generated only between electrodes, in order to perform discharge in an entire discharge space, a whole external surface of an external electrode must be covered, and in order to extract light to the outside, the external electrode must transmit light.

For this reason, an electrode obtained by preparing a thin metal wire into a network is used. Since in this electrode, an as thin as possible wire is used so as not to shield light, the electrode is easily damaged with ozone which is generated with vacuum ultraviolet light, in the oxygen atmosphere. In order to prevent this, it becomes necessary to make surroundings of the lamp, that is, the interior of the irradiation device in the atmosphere of an inert gas such as nitrogen, and provide a window of synthetic quartz to extract irradiated light. The window of synthetic quartz is not only expensive consumable goods, but also causes loss of light.

Since a double cylindrical lamp has an external diameter of around 25 mm, a difference in a distance to an irradiation surface cannot be neglected between beneath a lamp axis and a lamp side, generating a great difference in illuminance. Accordingly, even if lamps are aligned closely, a uniform illuminance distribution is not obtained. When prepared into an irradiation device provided with a window of synthetic quarts, a distance in the oxygen atmosphere can be made to be uniform, and a uniform illuminance distribution is obtained.

When electrodeless field discharge is used, it is not necessary that an external electrode is prepared into a network. Only by providing an external electrode at a part of a lamp external surface, glow discharge is expanded to an entire discharge space. In an external electrode, an electrode which also functions as a light reflection plate, usually made of an aluminum block, is used on a rear surface of a lamp. However, since an external diameter of a lamp is large like the case of inductor barrier discharge, in order to obtain a uniform illuminance distribution, synthetic quartz becomes necessary.

The greatest characteristic of a tubule excimer lamp resides in a simple structure. Both ends of the quartz tube are closed, and simply, the gas for performing excimer light emission is sealed the interior.

An external diameter of a tube of the tubule lamp is around 6 to 12 mm, and when the external diameter is too large, high voltage becomes necessary for starting.

As the form of discharge, any of inductor barrier discharge and electrodeless field discharge can be used. A shape of the electrode is such that a surface contacting with the lamp may be a flat surface, but by adopting a shape matched to a curved surface of the lamp, the lamp can be fixed firm, and at the same time, discharge is more stabilized due to adherence of the electrode to the lamp. Alternatively, when a curved surface is formed to be a mirror surface with aluminum, this also becomes a light reflecting plate.

Since a Xe excimer lamp radiates a ultraviolet ray having the short wavelength of 172 nm at the simple wavelength, it is excellent in the luminous efficiency. Since this excimer light has a large oxygen absorption coefficient, it can generate a radical oxygen atom species and ozone at the high concentration with a minor amount of oxygen.

Additionally, it is known that the light energy at the short wavelength of 172 nm has the high ability to dissociate a bond of an organic substance. By this active oxygen and ozone, and the high energy possessed by ultraviolet radiation, modification of a polysilazane layer can be realized in a short time.

Accordingly, this enables irradiation to an organic material or a plastic substrate which easily undergoes shortening of the process time and reduction in a facility area associated with high throughput, and damage due to heat, as compared with a low pressure mercury lamp emitting the wavelength of 185 nm or 254 nm, or plasma washing.

Since the excimer lamp has the high light generation efficiency, it can be switched on by supply of low electric power. Additionally, since it does not emit light of the long wavelength which becomes cause for temperature rise due to light irradiation, and irradiates the energy at an ultraviolet region, that is, at a short wavelength range, it has the characteristic that rise in a surface temperature of a subject to be irradiated is suppressed. For this reason, the excimer lamp is suitable for modification-treating a material having a flexible film such as PET, which is said to easily undergo thermal influence.

Since when oxygen exists, vacuum ultraviolet ray is absorbed by oxygen, the efficiency at a step of irradiating ultraviolet ray is easily reduced, and accordingly, it is preferable that vacuum ultraviolet irradiation is performed in the state where the oxygen concentration is as low as possible. That is, the oxygen concentration at vacuum ultraviolet irradiation is preferably in the range of 10 to 100000 volume ppm, more preferably in the range of 50 to 50000 volume ppm, and further preferably in the range of 100 to 10000 volume ppm.

It is preferable that at vacuum ultraviolet irradiation, a dried inert gas is used as the gas filling the irradiation environment, and inter alia, it is preferable that a dried nitrogen gas is used from a view point of the cost. The oxygen concentration can be adjusted by measuring a flow rate of an oxygen gas and an inert gas which are introduced into the irradiation environment, and changing the flow rate ratio.

The inorganic polymer layer 103 has the shrinkage rate of a layer thickness after curing treatment to a film thickness before curing treatment ({(film thickness before curing treatment−layer thickness after curing treatment)/film thickness before curing treatment}×100) of preferably less than 10%, more preferably 9.5% or less, and further preferably 9.0% or less. On the other hand, the shrinkage rate is preferably 1.0% or more, and more preferably 2.0% or more. When the shrinkage rate is in the above-mentioned range, an amount of distortion such as curling which is generated in the laminated film due to the shrinkage stress can be suppressed, distortion such as curling is hardly generated, and there is a tendency that the inorganic polymer layer 103 is easily applied to a preparation process when used in organic EL element device illumination and display. The shrinkage rate can be controlled by adjusting a kind of the inorganic polymer to be used (e.g. a kind of polysilazane), and the curing condition (e.g. when vacuum ultraviolet ray is used, the light intensity and the irradiation time thereof).

(Structure Etc. of Laminated Film)

The laminated film 1 has a whole thickness of preferably 10 to 300 μm, and more preferably 20 to 150 μm. When a whole thickness of the laminated film 1 is in the above-mentioned range, in the case where the laminated film 1 is a long substrate, crease or twisting becomes difficult to be generated in the laminated film 1 at a step of manufacturing an electronic device such as an organic EL element, there is a tendency that it becomes easy to control the laminated film 1, and since an amount of light to be absorbed by the laminated film 1 becomes difficult to increase, there is a tendency that light emission from a light emitting layer to the outside is not decreased.

Meanwhile, when the laminated film 1 is utilized in organic EL device illumination and display, the yellowness YI of the laminated film 1 is preferably a lower value, and more preferably 10 or less. Such yellowness YI can be measured using spectrophotometry which can calculate tri-stimulus values XYZ as a measurement device, in accordance with JIS K 7373: 2006.

Additionally, when the laminated film 1 is utilized in organic EL device illumination and display, the laminated film 1 having high total light transmission is preferable. From such a view point, the total light transmission of the laminated film 1 is preferably 80% or more, and further preferably 85% or more. In addition, such total light transmission can be measured using a transmission measuring device having an integrating sphere as a measuring device, in accordance with JIS K7375:2008.

Furthermore, when the laminated film 1 is used in a substrate of the organic EL element for an image display device, the laminated film 1 having the low haze is preferable, and the haze is more preferably 10% or less, and further preferably 5% or less. Meanwhile, when the laminated film 1 is used in a substrate for the organic EL element for illumination, since not only the haze is not cared too much from the utility, but also when a light emitting surface of organic EL emits light ununiformly in the state where the concentration difference or spots are generated, the higher haze conversely shades off ununiform light emission, from such a view point, the high haze can also be suitably utilized. In this way, the laminated film 1 can be used while the property thereof is appropriately changed to suitable design, depending on intended use of the organic EL element.

Additionally, as such a laminated film 1, a sufficiently flexible laminated film (having sufficient flexibility) is preferable. By preparing into such a flexible film, the laminated film can be more suitably utilized in intended use requiring flexibility.

[Organic EL Element]

Figure 2:
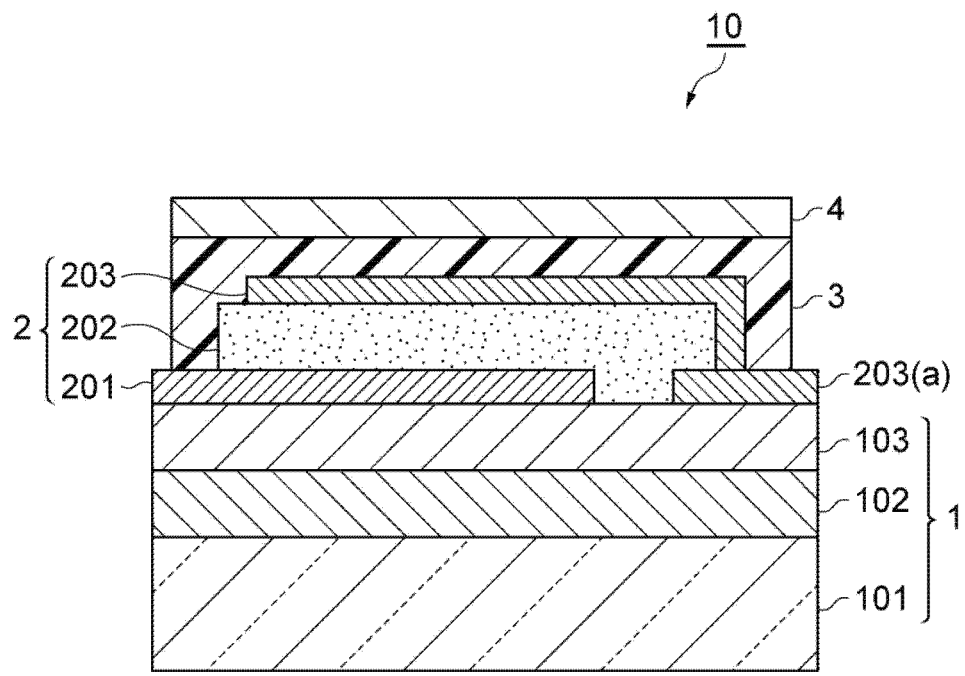
FIG. 2 is a schematic cross-sectional view showing one embodiment of an organic electroluminescent element.
Figure 3:
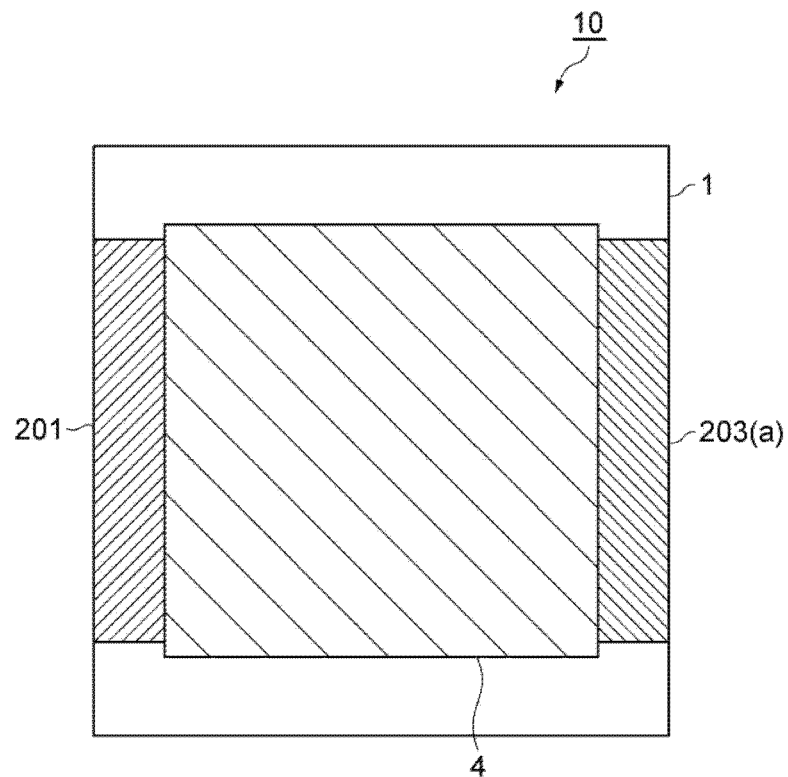
FIG. 3 is a top view schematically showing a structure when an organic electroluminescent element shown in FIG. 2 is seen from a sealing substrate side.

FIG. 2 is a schematic cross-sectional view showing one embodiment of the organic EL element, and FIG. 3 is a top view schematically showing a structure when the organic EL element shown in FIG. 2 is seen from a sealing substrate side. As shown in FIG. 2, the organic EL element 10 of the present embodiment is provided with a laminated film 1 as a supporting substrate (transparent supporting substrate), a light emitting element portion 2, a sealing material layer 3, and a sealing substrate 4. Each member will be illustrated in detail below. In addition, as the laminated film 1, the laminated film 1 of the present embodiment provided with the resin substrate 101, the gas barrier layer 102 and the inorganic polymer layer 103 is used. Additionally, as the laminated film 1, colorless transparent one is used, and as described above, one having the total light transmission of preferably 80% or more, and more preferably 85% or more is used.

(Light Emitting Element Portion 2)

The light emitting element portion 2 is provided with one pair of electrodes (first electrode 201 and second electrode 203) and a light emitting layer 202 arranged between the electrodes. One pair of electrodes 201, 203 and the light emitting layer 202 arranged between the electrodes, which constitute such a light emitting element portion 2, are not particularly limited, but the electrodes and the light emitting layers which are utilized in the known organic EL element can be appropriately utilized. For example, examples include that an electrode on a light extraction surface side is transparent or translucent, and a low-molecular and/or high-molecular organic light emitting material are (is) used in the light emitting layer. Such first electrode 201, light emitting layer 202, and second electrode 203 will be illustrated in detail below.

<First Electrode 201>

The first electrode 201 is an electrode of one of an anode and a cathode. In the light emitting element portion 2 of the embodiment shown in FIG. 2, as the first electrode 201, an electrode showing optical transparency (transparent or translucent electrode) is used, in order to enable emission of light which is radiated from the light emitting layer 202 to the outside of the light emitting element portion 2. In such an embodiment shown in FIG. 2, the first electrode 201 showing optical transparency is utilized as an anode.

As such a first electrode 201 (anode) exhibiting optical transparency, a thin film of a metal oxide, a metal sulfide and a metal can be used, and an electrode having higher electrical conductivity and light transmission is suitably used. Examples of such an electrode composed of a thin film of a metal oxide, a metal sulfide and a metal include thin films composed of indium oxide, zinc oxide, tin oxide, ITO (Indium Tin Oxide), Indium Zinc Oxide (abbreviation: IZO), gold, platinum, silver, and copper. As such a thin film of a metal oxide, a metal sulfide and a metal, a thin film composed of ITO, IZO, or tin oxide is more preferable. A method of producing such a thin film of a metal oxide, a metal sulfide or a metal is not particularly limited, but the known method can be appropriately adopted, and for example, a vacuum deposition method, a sputtering method, an ion plating method, a plating method and the like can be adopted.

Additionally, as such a first electrode 201, an organic transparent electrically conductive film of polyaniline or a derivative thereof, polythiophene or a derivative thereof or the like may be used. Additionally, such a first electrode 201 may be a film-like electrode (A) composed of a resin having optical transparency, and a wire-like conductor having electrical conductivity which is arranged in the resin having optical transparency. As such a resin having optical transparency, a resin having higher light transmission is preferable, and examples thereof include polyolefin-based resins such as low density or high density polyethylene, an ethylene-propylene copolymer, an ethylene-butene copolymer, an ethylene-hexene copolymer, an ethylene-octene copolymer, an ethylene-norbornene copolymer, an ethylene-dimethano-octahydronaphthalene copolymer, polypropylene, an ethylene-vinyl acetate copolymer, an ethylene-methyl methacrylate copolymer, and an ionomer resin; polyester-based resins such as polyethylene terephthalate, polybutylene terephthalate, and polyethylene naphthalate; nylon-6, nylon-6,6, meta-xylenediamine-adipic acid polycondensate; amide-based resins such as polymethylmethacrylimide; acrylic-based resins such as polymethyl methacrylate; polystyrene, styrene-acrylonitrile-based resins such as a styrene-acrylonitrile copolymer, a styrene-acrylonitrile-butadiene copolymer, and polyacrylonitrile; hydrophobized cellulose-based resins such as cellulose triacetate, and cellulose diacetate; halogen-containing resins such as polyvinyl chloride, polyvinylidene chloride, polyfluorinated vinylidene, and polytetrafluoroethylene; a hydrogen-bonding resins such as polyvinyl alcohol, an ethylene-vinyl alcohol copolymer, and a cellulose derivative; engineering plastic-based resins such as a polycarbonate resin, a polysulfone resin, a polyether sulfone resin, a polyether ether ketone resin, a polyphenylene oxide resin, a polymethylene oxide resin, a polyarylate resin, and a liquid crystal resin. In addition, from a view point that when an organic layer is manufactured from such a resin constituting the first electrode 201 on an anode by a coating method, the resin becomes difficult to be dissolved in a coating liquid, as such a resin, a thermosetting resin, a photocurable resin, and a photoresist material are suitably used.

Additionally, as the wire-like conductor, one having a small diameter is preferable. A diameter of the wire-like conductor is preferably 400 nm or less, more preferably 200 nm or less, and further preferably 100 nm or less. Since such a wire-like conductor diffracts or scatters light passing through the first electrode 201, it enhances the haze value of the first electrode 201, and at the same time, reduces transmission of light, and by using the wire-like conductor having a diameter equivalent to the wavelength of visible light or smaller than the wavelength of visible light, the haze value to visible light can be suppressed low, and at the same time, transmission of light can be improved. Additionally, since the resistance hardly becomes high, a diameter of the wire-like conductor is preferably 10 nm or more. In addition, in the case where the EL element is used in an illumination device, since when the haze value of the first electrode 201 is high to some extent, a wider range can be illuminated, the first electrode 201 having the high haze value is suitably used, in some cases. Like this, optical properties of the first electrode 201 can be appropriately set depending on a device in which the organic EL element is used.

Additionally, the number of wire-like conductors contained in such a film-like electrode (A) may be one, or plural. It is preferable that such a wire-like conductor forms a network structure in the electrode (A). That is, it is preferable that in the electrode (A), one or plural wire-like conductors is (are) arranged so as to complicatedly entangle in the whole resin to form a network structure (a structure in which one wire-like conductor is complicatedly entangled, or a network structure which is formed by arranging a plurality of wire-like conductors in contact with each other to expand two-dimensionally or three-dimensionally). Furthermore, such a wire-like conductor may be, for example, curve-shaped, or needle-shaped. By mutually contacting curve-shaped and/or needle-shaped conductors to form a network structure, the first electrode 201 having low volume resistivity can be realized. This network structure may be regular, or may not be regular. By the wire-like conductor forming a network structure, volume resistivity of the first electrode 201 can also be reduced.

It is preferable that at least a part of the wire-like conductors is arranged in the vicinity of a surface on a side opposite to the laminated film 1 on which the first electrode 201 is arranged (in the present embodiment, a surface on a side of the light emitting layer 202). By arranging wire-like conductors like this, the resistance of a surface portion of the first electrode 201 can be reduced. In addition, as a material of such a wire-like conductor, for example, a metal having the low resistance such as silver, gold, copper, aluminum and an alloy thereof is suitably used. The wire-like conductor can be produced, for example, by the method of N. R. Jana, L. Gearheart and C. J. Murphy (Chm. Commun., 2001, p 617-p 618), and the method by C. Ducamp-Sanguesa, R. Herrera-Urbina, and N. Figlarz (J. Solid State Chem., Vol. 100, 1992, p 272-p 280). Alternatively, such an electrode (A) may have the same configuration as that of the electrode described in JP-A-2010-192472, and as a method of producing it, the method described in JP-A-2010-192472 can be adopted.

Additionally, a film thickness of such a first electrode 201 (anode) is appropriately set in view of required properties and simplicity of a step, and for example, is 10 to 10000 nm, preferably 20 to 1000 nm, and more preferably 50 to 500 nm.

<Light Emitting Layer 202>

The light emitting layer 202 may be a layer composed of the known material which can be utilized in the light emitting layer (layer having the function of emitting light) of the organic EL element, a material thereof and the like are not particularly limited, but the layer is preferably a light emitting layer composed of an organic material. Such a light emitting layer composed of an organic material is not particularly limited, but for example, is preferably a layer formed of an organic substance emitting fluorescence or phosphorescence (a low-molecular compound and a high-molecular compound) as a luminescent material, and a dopant assisting this. In addition, the high-molecular compound mentioned herein is one having a number average molecular weight of polystyrene conversion of $1\times10^3$ or more. In addition, there is no particular reason why an upper limit of such a number average molecular weight is defined, but an upper limit of a number average molecular weight of polystyrene conversion is usually preferably $1\times10^8$ or less.

Examples of such a luminescent material (organic substance emitting fluorescence or phosphorescence) include a dye-based material, a metal complex-based material, a high-molecular-based material and the like. Examples of such a dye-based material include a cyclopentamine derivative, a tetraphenylbutadiene derivative compound, a triphenylamine derivative, an oxadiazole derivative, a pyrazoloquionline derivative, a distyrylbenzene derivative, a distyrylarylene derivative, a pyrrole derivative, a thiophene ring compound, a pyridine ring compound, a perinone derivative, a perylene derivative, an oligothiophene derivative, an oxadiazole dimer, a pyrazoline dimer and the like.

Additionally, examples of the metal complex-based material include metal complexes which has a central metal of aluminum, zinc, beryllium or the like, or a rare earth metal such as terbium, europium, and dysprosium, and a ligand of an oxadiazole, thiadiazole, phenylpyridine, phenylbenzimidazole or quinoline structure, such as an alumiquinolinol complex, a benzoquinolinolberyllium complex, a benzoxazolylzinc complex, a benzothiazolezinc complex, an azomethylzinc complex, a porphyrinzinc complex, and a europium complex.

Furthermore, examples of the high-molecular-based material include a polyparaphenylenevinylene derivative, a polythiophene derivative, a polyparaphenylene derivative, a polysilane derivative, a polyacetylene derivative, a polyfluorene derivative, a polyvinylcarbozole derivative, a material obtained by polymerizing the plastid or the metal complex-based light emitting material, and the like.

Among such luminescent materials, examples of a material emitting blue light include a distyrylarylene derivative, an oxadiazole derivative, and a polymer thereof, a polyvinyl carbazole derivative, a polyparaphenylene derivative, a polyfluorene derivative and the like. Among them, a polyvinylcarbozole derivative, a polyparaphenylene derivative and a polyfluorene derivative which are a polymer material are preferable.

Additionally, examples of a luminescent material emitting green light include a quinacridone derivative, a coumarin derivative, and a polymer thereof, a polyparaphenylenevinylene derivative, a polyfluorene derivative and the like. Among them, a polyparaphenylenevinylene derivative, a polyfluorene derivative and the like which are a polymer material are preferable.

Additionally, examples of a luminescent material emitting red light include a coumarin derivative, a thiophene ring compound, and a polymer thereof, a polyparaphenylenevinylene derivative, a polythiophene derivative, a polyfluorene derivative and the like. Among them, a polyparaphenylenevinylene derivative, a polythiophene derivative, a polyfluorene derivative and the like which are a polymer material are preferable.

Additionally, a process for producing such a fluorescent material is not particularly limited, but the known process can be appropriately adopted, and for example, the process described in JP-A-2012-144722 may be adopted.

Additionally, in the light emitting layer 202, it is preferable that a dopant is added for the purpose of improving the light emitting efficiency or changing the light emitting wavelength. Examples of such a dopant include a perylene derivative, a coumarin derivative, a rubrene derivative, a quinacridone derivative, a squalium derivative, a porphyrin derivative, a styryl-based dye, a tetracene derivative, a pyrazolone derivative, decacyclene, phenoxazone and the like. In addition, it is preferable that a thickness of such a light emitting layer is usually about 2 to 200 nm.

A method of forming such a light emitting layer 202 is not particularly limited, but the known method can be appropriately adopted. Among the method of forming such a light emitting layer 202, it is preferable to form the layer by a coating method. The coating method is preferable in that a production process can be simplified, and in that productivity is excellent. Examples of such a coating method include a casting method, a spin coating method, a bar coating method, a blade coating method, a roll coating method, gravure printing, screen printing, an inkjet method and the like. When the light emitting layer is formed using the coating method, first, a composition in the solution state containing a light emitter and a solvent is prepared as a coating liquid, this coating liquid is coated on a desired layer or electrode by the above-mentioned predetermined coating method, and further, this is dried, thereby, the light emitting layer having a desired film thickness can be formed.

<Second Electrode 203>

The second electrode 203 is an electrode having polarity reverse to that of the first electrode 201, and is arranged opposed to the first electrode 201. In addition, in the embodiment shown in FIG. 2, the second electrode is a cathode.

A material of such a second electrode 203 (cathode) is not particularly limited, but the known material can be appropriately utilized, and it is preferable to utilize a material which has a small work function, easily injects electrons into the light emitting layer 202, and has high electrical conductivity. Additionally, as in the embodiment shown in FIG. 2, in the organic EL element having a configuration that light is extracted from an anode side, from a view point that light which is radiated from the light emitting layer is reflected toward an anode side at a cathode to effectively extract light, a material having high visible reflectivity is preferable as a material of the second electrode 203 (cathode).

As a material of such a second electrode 203 (cathode), for example, an alkali metal, an alkaline earth metal, a transition metal and Group 13 metals of Periodic Table can be used. More specifically, as a material of the second electrode 203 (cathode), metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, alloys of two or more of the metals, alloys of one or more of the metals, and one or more of gold, silver, platinum, copper, manganese, titanium, cobalt, nickel, tungsten, and tin, or graphite or graphite intercalation compound can be suitably utilized. Examples of such an alloy include a magnesium-silver alloy, a magnesium-indium alloy, a magnesium-aluminum alloy, an indium-silver alloy, a lithium-aluminum alloy, a lithium-magnesium alloy, a lithium-indium alloy, a calcium-aluminum alloy and the like.

Additionally, as the second electrode 203 (cathode), a transparent electrically conductive electrode composed of an electrically, conductive metal oxide and an electrically conductive organic substance can also be used. Specifically, examples of the electrically conductive metal oxide include indium oxide, zinc oxide, tin oxide, ITO, and IZO, and examples of the electrically conductive organic substance include polyaniline or a derivative thereof, polythiophene or a derivative thereof and the like. In addition, the second electrode 203 (cathode) may be composed of a laminate in which two or more layers are laminated. Alternatively, a so-called electron injection layer may be used as a cathode.

A film thickness of such a second electrode 203 (cathode) is not particularly limited, but can be appropriately designed in view of required properties and simplicity of a step, and is preferably 10 nm to 10000 nm, more preferably 20 nm to 1000 nm, and further preferably 50 nm to 500 nm. Examples of a method of preparing such a second electrode 203 (cathode) include a vacuum deposition method, a sputtering method, and a laminating method of thermocompression bonding a metal thin film.

In addition, in the embodiment shown in FIG. 2, the second electrode 203 (cathode) is electrically connected to a connecting part (extracting electrode 203 (a)) so that it canoe electrically connected to the outside. Herein, in the embodiment shown in FIG. 2, the extracting electrode 203 (a) is formed of the same material as that of the first electrode 201. Such an extracting electrode 203 (a) can be appropriately produced and designed by known method, and for example, when the first electrode 201 is formed, a part of the extracting electrode 203 (a) is concurrently formed by pattern film formation, thereby, the second electrode 203 can be easily produced.

<Relationship Between Laminated Film Land Light Emitting Element Portion 2>

A light emitting element portion 2 provided with the above-mentioned one pair of electrodes 201, 203 and the light emitting layer 202 arranged between the electrodes is arranged on a surface of a gas barriering laminated film (supporting substrate) 1, and one electrode (first electrode 201) of the light emitting element portion 2 is laminated on the resin substrate 101 of the laminated film 1 via the gas barrier layer 102 and the inorganic polymer layer 103. Herein, as shown in FIG. 3, the light emitting element portion 2 can be arranged only on a part of a surface of the laminated film 1. By arranging one electrode (first electrode 201) between the laminated film 1 and the resin substrate 101 via the gas barrier layer 102 and the inorganic polymer layer 103 in this way, it becomes possible to prevent the water vapor from entering the light emitting element portion 2 from a laminated film 1 side at the higher level. In addition, when one electrode (first electrode 201) of the light emitting element portion 2 is directly arranged on a surface of the resin substrate 101 without via the gas barrier layer 102 and the inorganic polymer layer 103, entrance of water into the light emitting element portion 2 occurs due to moisture contained in the resin substrate 101, and it becomes difficult to sufficiently suppress deterioration.

<Sealing Material Layer 3>

The sealing material layer 3 is a layer which is arranged on the laminated film 1 so as to seal the light emitting element portion 2, and a layer composed of the known sealing material (e.g. a sheet of an adhesive material having sufficiently low water vapor transmittability) can be appropriately utilized. That is, such a sealing material layer 3 is a layer which seals the light emitting element portion 2 so as to cover the surroundings thereof 2 on the laminated film 1 so that the light emitting layer 202 does not contact with the outside air. In addition, upon such sealing, in order to function as a light emitting element, as shown in FIG. 2 and FIG. 3, one pair of electrodes are sealed except for a connecting part for electrically connecting to the outside (For example, a connecting wiring and a part of a so-called extracting electrode, and in the embodiment shown in FIG. 2 and FIG. 3, a part of an extracting electrode 203 (a) connected to a second electrode 203 as well as a part which can be contacted with the outside air of the first electrode

201 (one part of the first electrode which is extracted to the outside) correspond to a connecting part).

In view of adhesiveness, heat resistance, and barrier property to moisture, oxygen etc., a sealing material which forms such a sealing material layer 3 can be appropriately formed using the previously known optional suitable material, and for example, in addition to an epoxy resin, a silicone resin, an acrylic resin, a methacrylic resin etc., a curing adhesive such as the previously known thermosetting adhesive, photocurable adhesive and two-pack mixing curable adhesive can be appropriately utilized. In addition, in order to form such a sealing material layer 3, a sheet-like sealing material may be utilized. Such a sheet-like sealing material can be formed by appropriately molding the material by the known method.

Additionally, a thickness of such a sealing material layer 3 is not particularly limited, but may be such a thickness that can cover the light emitting element portion 2 so that it can be sealed, and is preferably 1 to 120 µm, more preferably 3 to 60 µm, further preferably 5 to 50 µm, and particularly preferably 10 to 40 µm. When a thickness of such a sealing material layer (thickness between the laminated film 1 and the sealing substrate 4) is in the above-mentioned range, the mechanical strength is hardly reduced, and when the pressure is added to the sealing substrate 4 from the outside, a possibility that the light emitting element portion 2 is pushed to cause short circuit between the first electrode 201 and the second electrode 203 tends to reduce, and there is a tendency that an amount of the moisture which enters the sealing material layer 3 through an end thereof is hardly increased, and deterioration of organic EL becomes difficult to be generated.

<Sealing Substrate 4>

The sealing substrate 4 is a substrate which is arranged on the sealing material layer 3, and is used from a view point that the water vapor and oxygen are effectively suppressed from entering the interior of the light emitting element portion 2 from on a surface on a side opposite to a side contacting with the laminated film 1 of the sealing material layer 3, and from a view point that heat releasability is improved. In addition, since the sealing material layer 3 is arranged so as to cover the light emitting element portion 2, in the embodiment shown in FIG. 2, it follows that the sealing material layer 3 exists between the light emitting element portion 2 and the sealing substrate 4. Like this, in the embodiment shown in FIG. 2, the sealing substrate 4 is arranged on the sealing material layer 3 so that the light emitting element portion 2 and the sealing material layer 3 intervene between the laminated film 1 and the sealing substrate 4.

As such a sealing substrate 4, one composed of the known material can be appropriately utilized, and for example, a sealing substrate composed of a plate or a foil of a metal such as copper and aluminum or an alloy containing the metal, a glass, a plastic substrate in which a barrier layer is laminated and the like can be suitably utilized. Additionally, such a sealing substrate 4 may be a rigid substrate, or may be a flexible substrate.

Additionally, from a view point of heat releasability and easiness of working, it is preferable that a material of such a sealing substrate 4 is composed of any metal material of copper, copper alloy, aluminum and aluminum alloy. Examples of the sealing substrate 4 composed of such a metal material include an aluminum foil and a copper foil, as preferable one.

Furthermore, among such a sealing substrate 4, a copper foil produced by an electrolytic method is more preferable from a view point that there is a tendency that pinholes are reduced more, and the higher effect is obtained in a point of prevention of entrance of the water vapor and oxygen. That is, by using such a copper foil produced by an electrolytic method (copper foil) in the sealing substrate 4, it becomes possible to more effectively seal the organic EL element, thereby, it becomes possible to more sufficiently suppress the organic EL element from being deteriorated, due to entrance of the moisture through pinholes of the copper foil. In addition, such an electrolytic method is not particularly limited, but the known electrolytic method which can produce a copper foil can be appropriately adopted.

Additionally, a thickness of such a sealing substrate 4 is not particularly limited, and is preferably 5 to 100 µm, and more preferably 8 to 50 µm. When a thickness of such a sealing substrate 4 is in the above-mentioned range, it becomes possible to suppress generation of pinholes at manufacturing of the sealing substrate 4, and there is a tendency that it becomes possible to more suppress moisture from entering through pinholes to deteriorate the organic EL element, additionally, flexibility of the sealing substrate 4 is hardly reduced, and as a result, a radius of curvature when the organic EL element is bent is hardly increased, and flexibility of the organic EL element tends to hardly reduce.

Additionally, a distance between the sealing substrate 4 and the light emitting element portion 2 (a thickness of the sealing material layer 3 between the light emitting element portion 2 and the sealing substrate 4: a distance between a surface contacting with the sealing material layer 3 of the second electrode 203 and a surface contacting with the sealing material layer 3 of the sealing substrate 4) in a thickness direction (direction vertical to the sealing substrate 4) is preferably 5 to 120 µm, and more preferably 10 to 60 µm. When such a distance between the sealing substrate 4 and the light emitting element portion 2 is in the above-mentioned range, contact between the second electrode 203 and the sealing substrate 4 can be suppressed at bending, there is a tendency that it becomes possible to suppress generation of short circuit, there is a tendency that light emission quality becomes to hardly reduce, and furthermore, there is a tendency that a possibility that the second electrode 203 is pushed by application of the pressure due to irregularities of a surface of the sealing substrate 4 at bending, and is contacted with the first electrode 201, thereby, short circuit is caused is reduced. Additionally, a surface contacting with the outside air of the sealing material layer 3 is hardly increased, an amount of the water vapor which enters from a transverse direction of the sealing material layer 3 (direction vertical to a thickness direction: direction parallel with a surface of the laminated film 1) is hardly increased, and there is a tendency that it becomes possible to suppress reduction in a storage life of the organic EL element.

In addition, it is preferable to utilize such a sealing substrate 4, so that surface roughness of a surface on a sealing material layer 3 side of the sealing substrate 4 becomes a value smaller than surface roughness of the other surface of the sealing substrate 4 (external side surface roughness), based on standard of arithmetic average roughness Ra of JIS B 0601-1994. When such arithmetic average roughness of a surface on a sealing material layer 3 side of the sealing substrate 4 becomes a value smaller than arithmetic average roughness Ra of the other surface of the sealing substrate 4, there is a tendency that short circuit becomes difficult to occur, such as that the light emitting element portion 2 becomes difficult to be damaged by an irregular shape (irregular shape which is present due to roughness of surface) on a surface of the sealing substrate 4, when the organic EL element is bent. In addition, treatment of smoothing surface roughness of such a sealing substrate 4 can also be performed separately, but when such smoothing treatment (e.g. polishing or surface treatment) is performed, the cost is increased, the economic efficiency at manufacturing of the organic EL element is deteriorated, not only large scale production becomes difficult, but also when a surface is smoothed too much, adherability with the sealing material layer 3 is deteriorated, and peeling easily occurs, and there is a tendency that it becomes difficult to use the organic EL element over long period of time. Additionally, there is also a tendency that, when a surface of the sealing substrate 4 becomes smooth, the radiation rate is reduced, and it becomes difficult to release heat.

In addition, a method of laminating such sealing material layer 3 and sealing substrate 4 is not particularly limited, but the known method can be appropriately adopted, and for example, a method of coating a sealing material composed of a material having adhesiveness so as to cover the light emitting element portion 2 on the laminated film 1, laminating the sealing substrate 4 thereon, and thereafter, sticking the sealing material to laminate the sealing material layer 3 and the sealing substrate 4 on the laminated film 1 may be adopted. Alternatively, a method of forming a layer composed of a sealing material on the sealing substrate 4 in advance, and pushing the sealing substrate 4 on which a layer composed of such a sealing material is formed while the layer composed of the sealing material is enabled to cover the surroundings of the light emitting element portion 2, and laminating the sealing material layer 3 and the sealing substrate 4 on the laminated film 1 may be adopted.

Preferable embodiments of the laminated film of the present invention and the organic EL elements using it were illustrated referring to the drawings, but the laminated film of the present invention and the organic EL element using it are not limited to the above-mentioned embodiments.

For example, in embodiments shown in FIG. 1 and FIG. 2, the laminated film 1 has a structure in which the resin substrate 101, the gas barrier layer 102 and the inorganic polymer layer 103 are laminated in this order, but the laminated film 1 may be further provided with, for example, a primer-coated layer, a heat sealing resin layer or the like, if necessary, on a surface of the resin substrate 101 and/or the inorganic polymer layer 103, in addition to the above-mentioned layers.

Additionally, since higher gas barrier property is obtained, a gas barrier layer 102 may be further formed on a surface on a side opposite to the gas barrier layer 102 of the resin substrate 101, and an inorganic polymer layer 103 may be further formed on the gas barrier layer 102. That is, the gas barrier layer 102 and the inorganic polymer layer 103 may be formed on both sides of the resin substrate 101.

Additionally, in the embodiment of the organic EL element shown in FIG. 2, the light emitting element portion 2 is provided with one pair of electrodes (first electrode 201, second electrode 203) and the light emitting layer 202 arranged between the electrodes, but the light emitting element portion 2 may be appropriately provided with other layers, in such a range that the object and the effect of the present invention are not deteriorated. Such other layers will be illustrated below.

As other layers other than one pair of electrodes (first electrode 201, second electrode 203) and the light emitting layer 202, which can be utilized in such an organic EL element, the known layers utilized in the organic EL element can be appropriately utilized, and examples include a layer provided between a cathode and a light emitting layer, and a layer provided between an anode and a light emitting layer. Examples of such a layer provided between a cathode and a light emitting layer include an electron injection layer, an electron transport layer, a hole block layer and the like. In addition, when only one layer is provided between a cathode and a light emitting layer, such a layer is an electron injection layer. Additionally, when two or more layers are provided between a cathode and a light emitting layer, a layer contacting with a cathode is named as electron injection layer, and other layers are named as electron transport layer.

Such an electron injection layer is a layer having the function of improving the efficiency of injecting electrons from a cathode, and the electron transport layer is a layer having the function of improving electron injection from the electron injection layer or an electron transport layer nearer a cathode. In addition, when the electron injection layer or the electron transport layer has the function of arresting transport of holes, these layers are called hole block layer in some cases. Concerning possession of the function of arresting transport of holes, the arresting effect can be confirmed by preparing an element which flows only a hole current, and measuring decrease in a value of the current.

Examples of the layer provided between an anode and a light emitting layer include a so-called hole injection layer, hole transport layer, electron block layer and the like. Herein, when only one layer is provided between an anode and a light emitting layer, such a layer is a hole injection layer, and when two or more layers are provided between an anode and a light emitting layer, a layer contacting with an anode is named as hole injection layer, and other layers are named as hole transport layer or the like. Such a hole injection layer is a layer having the function of improving the efficiency of hole injection from a cathode, and the hole transport layer is a layer having the function of improving hole injection from a hole injection layer or a hole transport layer nearer an anode. Additionally, when a hole injection layer, or a hole transport layer has the function of arresting transport of electrons, these layers are named as electron block layer in some cases. In addition, concerning possession of the function of arresting transport of electrons, the arresting effect can be confirmed, for example, by preparing an element which flows only an electron current, and measuring decrease in a value of the current.

Additionally, examples of a structure of the light emitting element portion provided with such other elements include a structure in which an electron transport layer is provided between a cathode and a light emitting layer, a structure in which a hole transport layer is provided between an anode and a light emitting layer, a structure in which an electron transport layer is provided between a cathode and a light emitting layer, and a hole transport layer is provided between an anode and a light emitting layer and the like. As such a structure, specifically, structures of the following a) to d) can be exemplified.

a) Anode/light emitting layer/cathode (embodiment shown in FIG. 2)
b) Anode/hole transport layer/light emitting layer/cathode
c) Anode/light emitting layer/electron transport layer/cathode
d) Anode/hole transport layer/light emitting layer/electron transport layer/cathode
(Herein, / indicates that respective layers are laminated adjacent to each other. The same applies hereinafter.)

Herein, the hole transport layer is a layer having the function of transporting holes, and the electron transport layer is a layer having the function of transporting electrons.

In addition, the electron transport layer and the hole transport layer are collectively called as charge transport layer. Additionally, the light emitting layer, the hole transport layer, and the electron transport layer may be such that two or more layers are used independently, respectively. Additionally, among charge transport layers provided adjacent to an electrode, a layer having the function of improving the efficiency of charge injection from an electrode, and having the effect of reducing a driving voltage of an element is generally called as particularly charge injection layer (hole injection layer, electron injection layer) in some cases.

Furthermore, in order to improve adherability with an electrode or improve charge injection from an electrode, the charge injection layer or an insulating layer having a film thickness of 2 nm or less may be provided adjacent to an electrode, and in order to improve adherability of an interface or prevent mixing of an interface, a thin buffer layer may be inserted into an interface of the charge transport layer or the light emitting layer. Like this, the order and the number of layers which are laminated on the light emitting element portion, and a thickness of each layer can be appropriately designed and used, in view of the light emitting efficiency and the element life.

Examples of the light emitting element portion (organic EL element portion) on which such a charge injection layer (electron injection layer, hole injection layer) is provided include a portion having a structure in which a charge injection layer is provided adjacent to a cathode, a portion having a structure in which a charge injection layer is provided adjacent to an anode, and the like.

As a structure of such a light emitting element portion (organic EL element portion), for example, structures of the following e) to p) are exemplified.
e) Anode/charge injection layer/light emitting layer/cathode
f) Anode/light emitting layer/charge injection layer/cathode
g) Anode/charge injection layer/light emitting layer/charge injection layer/cathode
h) Anode/charge injection layer/hole transport layer/light emitting layer/cathode
i) Anode/hole transport layer/light emitting layer/charge injection layer/cathode
j) Anode/charge injection layer/hole transport layer/light emitting layer/charge injection layer/cathode
k) Anode/charge injection layer/light emitting layer/charge transport layer/cathode
l) Anode/light emitting layer/electron transport layer/charge injection layer/cathode
m) Anode/charge injection layer/light emitting layer/electron transport layer/charge injection layer/cathode
n) Anode/charge injection layer/hole transport layer/light emitting layer/charge transport layer/cathode
o) Anode/hole transport layer/light emitting layer/electron transport layer/charge injection layer/cathode
p) Anode/charge injection layer/hole transport layer/light emitting layer/electron transport layer/charge injection layer/cathode In addition, when the light emitting layer and other layer (e.g. charge transport layer described later etc.) are laminated, it is desirable that before provision of the light emitting layer, the hole transport layer is formed on an anode, or after provision of the light emitting layer, the electron transport layer is formed. Additionally, a material of these other layers is not particularly limited, but the known materials can be appropriately utilized, and a process for producing them is also not particularly limited, but the known processes can be appropriately utilized. For example, examples of a hole transporting material for forming a hole transport layer, which is a layer provided between an anode and a light emitting layer, or between a hole injection layer and a light emitting layer, include triphenylamines, bises, a heterocyclic compound, a representative of which is a pyrazoline derivative and a porphyrin derivative, and as a polymer, polycarbonate, a styrene derivative, polyvinylcarbazole, polysilane and the like having the above-mentioned monomer on a side chain. Additionally, a film thickness of such a hole transport layer is preferably around 1 nm to 1000 nm.

Additionally, examples of a material for forming a hole injection layer (layer which can be provided between an anode and a hole transport layer, or between an anode and a light emitting layer) among the charge injection layer includes phenylamine, star burst-type amine, phthalocyanine, oxides such as vanadium oxide, molybdenum oxide, ruthenium oxide, and aluminum oxide, amorphous carbon, polyaniline, a polythiophene derivative and the like.

Furthermore, examples of a material for forming an electron transport layer being a layer which can be provided between a light emitting layer and a cathode, or between a light emitting layer and an electron injection layer include substances which form a generally stable radical anion, and has the large ionization potential, such as oxadiazoles, and an aluminum quinolinol complex. Specifically, examples include a 1,3,4-oxadiazole derivative, a 1,2,4-triazole derivative, an imidazole derivative and the like. A film thickness of the electron transport layer is preferably around 1 nm to 1000 nm.

Additionally, as an electron injection layer (layer which is provided between an electron transport layer and a cathode, or between a light emitting layer and a cathode) among the charge injection layers, for example, an electron injection layer composed of a monolayer structure of a calcium layer, or an electron injection layer composed of a laminated structure of a layer formed of any one or two or more of a metal of Periodic Table Group IA and Group IIA except for calcium, having a work function of 1.5 to 3.0 eV, and an oxide, a halide and an oxycarbide of the metal, and a calcium layer can be provided, depending on a kind of the light emitting layer. Examples of the metal of Periodic Table Group IA having a work function of 1.5 to 3.0 eV, or the oxide, the halide or the oxycarbide thereof include lithium, lithium fluoride, sodium oxide, lithium oxide, lithium carbonate and the like. Additionally, examples of the metal of Periodic Table Group IIA except for calcium, having a work function of 1.5 to 3.0 eV, or the oxide, the halide, and the oxycarbide thereof include strontium, magnesium oxide, magnesium fluoride, strontium fluoride, barium fluoride, strontium oxide, magnesium carbonate and the like. The electron injection layer is formed by a deposition method, a sputtering method, a printing method or the like.

A film thickness of the electron injection layer is preferably around 1 nm to 1000 nm.

EXAMPLES

The present invention will be illustrated more specifically below based on Examples and Comparative Examples, but the present invention is not limited to the following Examples.
[Assessment Method]
<Gas Barrier Property>
Gas barrier property of the laminated film was assessed by Water Vapor Transmission Rate (WVTR). The water vapor transmission rate was calculated by a calcium corrosion method (the method described in JP-A-2005-283561) under the conditions of a temperature of 40° C. and humidity of 90% RH. That is, the water vapor transmission rate was calculated by depositing metal calcium on the laminated film after drying treatment, further depositing metal aluminum thereon, finally, sticking a glass using a sealing resin to obtain a sealed sample, and examining, concerning the sample, increase in a corrosion point due to change with time under the condition of a temperature of 40° C. and humidity of 90% RH, by image analysis. In addition, upon calculation of such water vapor transmission rate, the water vapor transmission rate was calculated by photographing a corrosion point with a microscope, fetching the image into a personal computer to binarize the image of a corrosion point, and obtaining a corrosion area by calculation. As a value of this water vapor transmission rate is smaller, gas barrier property is more excellent.

<Film Thickness>

A film thickness of the gas barrier layer and the inorganic polymer layer was measured by the following method. That is, the gas barrier layer was formed on the resin substrate, and the inorganic polymer layer was formed on the gas barrier layer, respectively, a level difference of resin substrate (non-film-formed part)/gas barrier layer, and gas barrier layer/inorganic polymer layer was measured using a surface roughness measuring instrument (manufactured by Kosaka Laboratory Ltd., trade name: Surfcorder ET200), and a film thickness of the gas barrier layer and that of the inorganic polymer layer were obtained.

<Irradiation of Electron Beam: Sampling>

After aluminum was deposited on the inorganic polymer layer at a thickness of 50 nm using a deposition device (manufactured by JEOL Ltd., trade name: DEE-420), carbon was deposited on aluminum at a thickness of 300 nm by a deposition method using a focused ion beam (FIB) machining observation device (manufactured by Hitachi High-Technologies Corporation, trade name: FB2200), and a cross-sectional sample having a width of 90 nm and a length of 10 μm was prepared by microsampling, at the condition under which damage due to machining using a focused ion beam does not enter a sample piece.

<Irradiation of Electron Beam: TEM Observation Condition>

Using FE-TEM (field emission transmission electron microscope, manufactured by JEOL Ltd., trade name: JEM-2200FS), a bright field image of the resulting cross-sectional sample was observed, under the condition of acceleration voltage of 200 kV, SPOT size 1.0 nm, CLA1, OLA1.

<Irradiation of Electron Beam: Electron Beam Irradiation Condition>

Using ASID mode of FE-TEM (manufactured by JEOL Ltd., trade name: JEM-2200FS), magnification was changed so that an electron beam is irradiated to the whole inorganic polymer layer in a film thickness, and thereafter, an electron beam was irradiated to a region containing the inorganic polymer layer of the resulting cross-sectional sample, under the condition of SPOT size 0.7 nm, Camera Length 8 cm, integration 2 msec, frame number 30, and electron beam irradiation amount of $1.30 \times 10^{16}$ ions/cm$^2$.

<Measurement of Standard Deviation>

A standard deviation of a histogram when a TEM observation image obtained by photographing so that a region containing a central part of the carbon-deposited layer and the inorganic polymer layer 103 has resolution of 512×512 pixel or more (thereupon, adjustment was performed so that resolution of one square obtained by dividing the inorganic polymer layer into twenty described below became 40×40 pixel), at the condition under which a gradation average value of a central part of the carbon layer which had been deposited upon the FIB machining became becomes 80 to 90 with a standard deviation of 3 to 5, was gray scale-displayed at 256 gradations using photo editor software (manufactured by Adobe, trade name: Photoshop Elements 11) was obtained, and used in calculating the Y. A standard deviation (σ) and a standard deviation (σn) were obtained from an electron beam-unirradiated part and an electron beam-irradiated part in the cross-sectional sample of the laminated film, respectively.

Comparative Example 1

(Preparation of Gas Barriering Laminated Film)

Using a manufacturing apparatus shown in FIG. 4, a gas barrier layer was formed on a resin substrate. That is, using a biaxially stretched polyethylene naphthalate film (abbreviation: PEN film, manufactured by Teijin DuPont Films Japan Limited, trade name: Teonex Q65HA, thickness 100 μm) as a resin substrate, the film was mounted on a delivery roll 11 in a vacuum chamber. The interior of the vacuum chamber was evacuated to $1 \times 10^{-3}$ Pa or less, and a film of the gas barrier layer was formed on the resin substrate while the resin substrate was conveyed at the constant rate of 0.5 m/min. In a plasma CVD device which was used for forming the gas barrier layer, plasma is generated between one pair of electrodes (film-forming rolls 31, 32), the resin substrate is conveyed while being tightly contacted with an electrode surface, and the gas barrier layer is formed on the resin substrate. Additionally, in the one pair of electrodes, a magnet (magnetic field generating devices 61, 62) is arranged in the electrode so that the magnetic flux density becomes high on a surface of the electrode and the resin substrate, and plasma is restrained on the electrode and the resin substrate at the high density, at plasma generation.

Upon formation of a film of the gas barrier layer, a hexamethyldisiloxane gas at 100 sccm (Standard Cubic Centimeter per Minute, 0° C., 1 atm standard), and an oxygen gas at 1000 sccm were introduced toward a space between electrodes becoming a film forming zone, alternate current electric power at 1.6 kW and the frequency of 70 kHz was supplied between electrode rolls, and electricity was discharged to generate plasma. Then, after an exhaust volume was regulated so that the pressure around an exhaust port in the vacuum chamber became 1 Pa, a gas barrier layer was formed on a conveyance resin substrate by a plasma CVD method. A thickness of the gas barrier layer of the resulting laminated film was 501.5 nm, the total light transmission was 91%, and the water vapor transmission rate was $1.6 \times 10^{-4}$ g/m$^2$/day.

Example 1

(Preparation of Gas Barriering Laminated Film)

Figure 6:
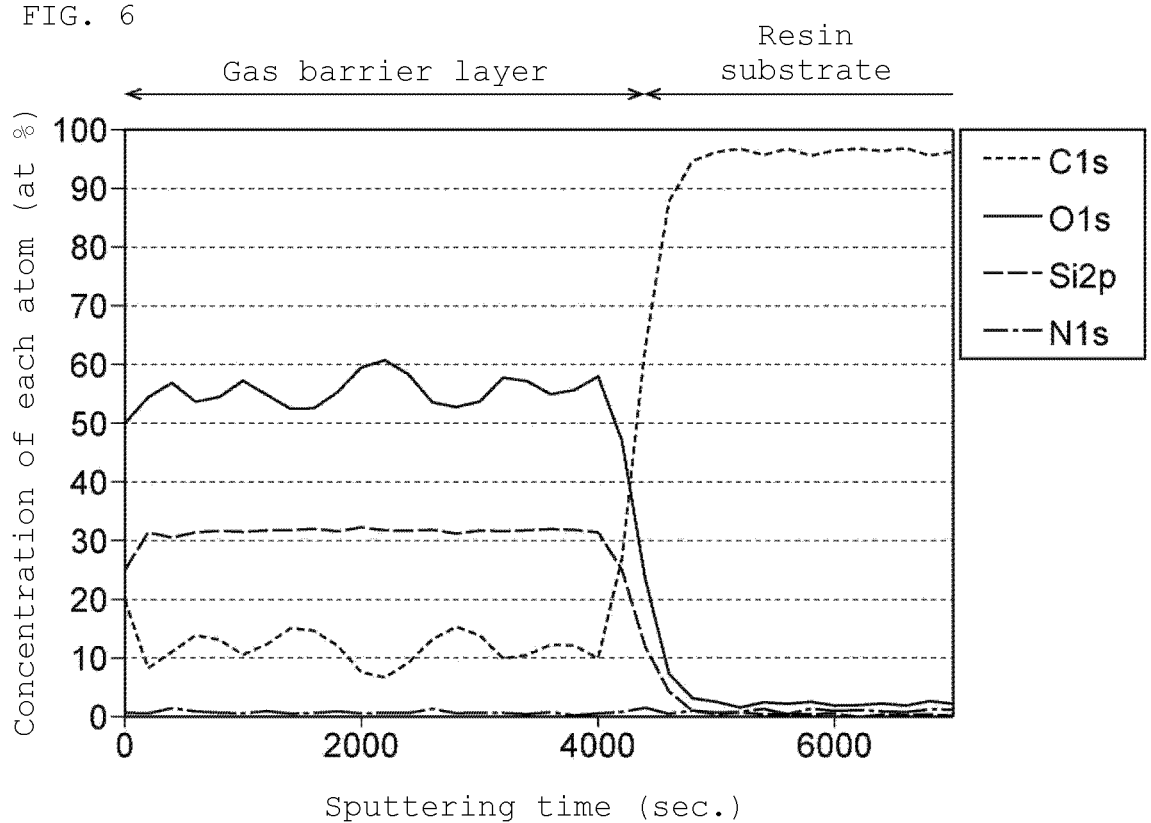
FIG. 6 is a graph showing the result of XPS depth profile measurement of a gas barrier layer in a gas barriering laminated film of Example 1.

According to the same manner as that of Comparative Example 1, a laminated film in which a gas barrier layer is laminated on a resin substrate was obtained. A graph made from distribution curves of a silicon atom, an oxygen atom, a carbon atom and a nitrogen atom of the gas barrier layer, obtained by XPS depth profile measurement, with a vertical axis as the concentration (at %) of each atom as the concentration of each element, and with a horizontal axis as a sputtering time is shown in FIG. 6. The etching rate was 0.09 nm/sec as expressed by a SiO$_2$ thermally oxidized film reduction value. As apparent from FIG. 6, the gas barrier layer prepared by the above-mentioned procedure satisfies the conditions (i) to (iii). Then, using a 20 mass % xylene solution of perhydropolysilazane (manufactured by Merck Performance Materials, trade name: AQUAMICA NL110-20A, palladium catalyst type) as an inorganic polymer layer coating liquid, the liquid was coated on the gas barrier layer of the laminated film by a spin coating method so that a film thickness after drying on a hot plate at 90° C. for 1 minute became 500.0 nm, and a polysilazane layer was formed.

Then, using a vacuum ultraviolet irradiation device (manufactured by M.D. Excimer, Inc., trade name: MEIRA-M-1-152-H2), the formed polysilazane layer was curing-treated at the condition under which integrated illuminance of vacuum ultraviolet light to be irradiated to the polysilazane layer became 6000 mJ/cm$^2$, while replacement was performed so that the oxygen concentration in the irradiation device became 300 volume ppm or less under the condition of a $N_2$ gas flow rate of 20 L/min, and an inorganic polymer layer was formed. Thereby, a laminated film in which the gas barrier layer and the inorganic polymer layer are laminated on the resin substrate was obtained. The inorganic polymer layer shrank to a film thickness of 458.3 nm by irradiation of vacuum ultraviolet light, and the shrinkage rate was 8.3%. The total light transmission of the resulting laminated film was 90%, and the water vapor transmission rate was 9.6× $10^{-7}$ g/m$^2$/day. From the result of analysis of the resulting TEM image, the Y of the inorganic polymer layer of the resulting laminated film was 0.121.

Example 2

(Preparation of Gas Barriering Laminated Film)

According to the same manner as that of Comparative Example 1, a laminated film in which a gas barrier layer is laminated on a resin substrate was obtained. Then, using a 20 mass % xylene solution of perhydropolysilazane (manufactured by Merck Performance Material, trade name: AQUAMICA NL110-20A, palladium catalyst type) as an inorganic polymer layer coating liquid, the liquid was coated on the gas barrier layer of the laminated film by a spin coating method so that a film thickness after drying on a hot plate at 90° C. for 1 minute became 500.0 nm, and a polysilazane layer was formed.

Then, using a vacuum ultraviolet irradiation device (manufactured by M.D. Excimer, Inc., trade name: MEIRA-M-1-152-H2), the formed polysilazane layer was curing-treated at the condition under which integrated illuminance of vacuum ultraviolet light to be irradiated to the polysilazane layer became 600 mJ/cm$^2$, while replacement was performed so that the oxygen concentration in the irradiation device became 300 volume ppm or less under the condition of a $N_2$ gas flow rate of 20 L/min, and an inorganic polymer layer was formed. Thereby, a laminated film in which the gas barrier layer and the inorganic polymer layer are laminated on the resin substrate was obtained. The inorganic polymer layer shrank to a film thickness of 495.0 nm by irradiation of vacuum ultraviolet light, and the shrinkage rate was 1.0%. The total light transmission of the resulting laminated film was 90%, and the water vapor transmission rate was 3.9× $10^{-5}$ g/m$^2$/day. From the result of analysis of the resulting TEM image, the Y of the inorganic polymer layer of the resulting laminated film was 0.209.

Example 3

(Preparation of Gas Barriering Laminated Film)

According to the same manner as that of Comparative Example 1, a laminated film in which a gas barrier layer is laminated on a resin substrate was obtained. Then, using a 20 mass % xylene solution of perhydropolysilazane (manufactured by Merck Performance Materials, trade name: AQUAMICA NL110-20A, palladium catalyst type) as an inorganic polymer layer coating liquid, the liquid was coated on the gas barrier layer of the laminated film by a spin coating method so that a film thickness after drying on a hot plate at 90° C. for 1 minute became 500.0 nm, and a polysilazane layer was formed.

Then, using a vacuum ultraviolet irradiation device (manufactured by M.D. Excimer, Inc., trade name: MEIRA-M-1-152-H2), the formed polysilazane layer was curing-treated at the condition under which integrated illuminance of vacuum ultraviolet light to be irradiated to the polysilazane layer became 2000 mJ/cm$^2$, while replacement was performed so that the oxygen concentration in the irradiation device became 300 volume ppm or less under the condition of a $N_2$ gas flow rate of 20 L/min, and an inorganic polymer layer was formed. Thereby, a laminated film in which the gas barrier layer and the inorganic polymer layer are laminated on the resin substrate was obtained. The inorganic polymer layer shrank to a film thickness of 480.0 nm by irradiation of vacuum ultraviolet light, and the shrinkage rate was 4.0%. The total light transmission of the resulting laminated film was 90%, and the water vapor transmission rate was 1.3× $10^{-5}$ g/m$^2$/day. Additionally, from the result of analysis of the resulting TEM image, the Y of the inorganic polymer layer of the resulting laminated film was 0.176.

Comparative Example 2

(Preparation of Gas Barriering Laminated Film)

Using a manufacturing apparatus shown in FIG. 5, a gas barrier layer was formed on a resin substrate. That is, using a biaxially stretched polyethylene naphthalate film (abbreviation: PEN film, manufactured by Teijin DuPont Films Japan Limited, trade name: Teonex Q65HA, thickness 100 μm) as a resin substrate, the film was mounted on a delivery roll 307 installed in a vacuum chamber 301, and it was set that the film can be continuously conveyed to a winding roll 310 via a film-forming zone 311 for the gas barrier layer. After the resin substrate was mounted, the interior of the vacuum chamber 301 was evacuated to 1×$10^{-3}$ Pa or less, and a film of the gas barrier layer was formed on the resin substrate while the resin substrate was conveyed at the constant rate of 0.1 m/min. Concerning conveyance of the resin substrate, the resin substrate was conveyed so that it was parallel with one of opposite two sides of a rectangular inductor window 312 mounted at a lower portion of the film-forming zone 311 for the gas barrier layer, and was in a direction vertical to remaining opposite two sides.

In a plasma CVD device used for forming the gas barrier layer, inductively coupled plasma was formed on the inductor window 312. The biaxially stretched polyethylene naphthalate film used in the resin substrate had an asymmetric structure in which one side had been subjected to treatment for easy adhesion, and a film of the gas barrier layer was formed on a surface which had not been subjected to treatment for easy adhesion. Upon film formation, a monosilane gas at 100 sccm (Standard Cubic Centimeter per Minute, 0° C., 1 atm standard), an ammonia gas at 500 sccm, and an oxygen gas at 0.75 sccm were introduced into the film-forming zone 311, electric power at 1.0 kW and the frequency of 13.56 kHz was supplied to an induction coil 303, and electricity was discharged to generate plasma. Then, an exhaust volume was regulated so that the pressure in the vacuum chamber 301 became 1 Pa, and the gas barrier layer was formed on a conveyance resin substrate by an inductively coupled plasma CVD method to obtain a laminated film. A thickness of the gas barrier layer in the resulting laminated film was 500.0 nm, the total light transmission was 90%, and the water vapor transmission rate was $2.2 \times 10^{-4}$ g/m²/day.

nated film in which the gas barrier layer and the inorganic polymer layer are laminated on the resin substrate was obtained. The inorganic polymer layer shrank to a film thickness of 456.5 nm by irradiation of vacuum ultraviolet light, and the shrinkage rate was 8.7%. The total light transmission of the resulting laminated film was 90%, and the water vapor transmission rate was $4.2 \times 10^{-6}$ g/m²/day. Additionally, from the result of analysis of the resulting TEM image, the Y of the inorganic polymer layer of the resulting laminated film was 0.125.

Results of assessment of the laminated films obtained in Examples and Comparative Example are summarized in the following Table 1.

TABLE 1

| | | Example 1 | Example 2 | Example 3 | Example 4 | Comparative Example 1 | Comparative Example 2 |
|---|---|---|---|---|---|---|---|
| | Method of forming gas barrier layer | Interroll discharge plasma CVD method | Interroll discharge plasma CVD method | Interroll discharge plasma CVD method | Inductively coupled plasma CVD method | Interroll discharge plasma CVD method | Inductively coupled plasma CVD method |
| Inorganic polymer layer | Raw material | Perhydro polysilazane | Perhydro polysilazane | Perhydro polysilazane | Perhydro polysilazane | — | — |
| | Film thickness (nm) | 458.3 | 495.0 | 480.0 | 456.5 | — | — |
| | Curing treatment condition | VUV (6 J/cm²) | VUV (0.6 J/cm²) | VUV (2 J/cm²) | VUV (6 J/cm²) | — | — |
| | Y value | 0.121 | 0.209 | 0.176 | 0.125 | — | — |
| | Total light transmission (%) | 90 | 92 | 90 | 90 | 91 | 90 |
| | WVTR (g/m²/day) | $9.6 \times 10^{-7}$ | $3.9 \times 10^{-5}$ | $1.3 \times 10^{-5}$ | $4.2 \times 10^{-6}$ | $1.6 \times 10^{-4}$ | $2.2 \times 10^{-4}$ |

Example 4

(Preparation of Gas Barriering Laminated Film)

According to the same manner as that of Comparative Examples 2, a laminated film on which a gas barrier layer is laminated on a resin substrate was obtained. A graph made from distribution curves of a silicon atom, an oxygen atom, a carbon atom and a nitrogen atom of the gas barrier layer, obtained by XPS depth profile measurement, with a vertical axis as the concentration (at %) of each atom as the concentration of each element, and with a horizontal axis as a sputtering time is shown in FIG. 7. The etching rate was 0.09 nm/sec as expressed by a $SiO_2$ thermally oxidized film reduction value. As apparent from FIG. 7, the gas barrier layer prepared by the above-mentioned procedure satisfies the conditions (iv) and (v). Then, a 20 mass % xylene solution of perhydropolysilazane (manufactured by Merck Performance Materials, trade name: AQUAMICA NL110-20A, palladium catalyst type) as an inorganic polymer layer coating liquid, the liquid was coated on the gas barrier layer of the laminated film by a spin coating method so that a film thickness after drying on a hot plate at 90° C. for 1 minute became 500.0 nm, and a polysilazane layer was formed.

Then, using a vacuum ultraviolet irradiation device (manufactured by M.D. Excimer, Inc., trade name: MEIRA-M-1-152-H2, wavelength 172 nm), the formed polysilazane layer was curing-treated at the condition under which integrated illuminance of vacuum ultraviolet light to be irradiated to the polysilazane layer became 6000 mJ/cm², while replacement was performed so that the oxygen concentration in the irradiation device became 300 volume ppm or less under the condition of a $N_2$ gas flow rate of 20 L/min, and an inorganic polymer layer was formed. Thereby, a lami-

What is claimed is:

1. A laminated film comprising at least a gas barrier layer and an inorganic polymer layer cured by vacuum ultraviolet light having a wavelength of 200 nm or less being laminated on a resin substrate, having a Y value of 0.180 or less, wherein the Y value is calculated from a transmission electron microscope image of a cross section of the inorganic polymer layer by the following procedure:

(a) a standard deviation ($\sigma$) of the contrast of an electron beam-unirradiated part of the inorganic polymer layer is calculated, the standard deviation $\sigma$ is obtained by:

preparing a laminated film of a width of 90 nm by microsampling using a focused ion beam machining observation device, obtaining a transmission electron microscope image by photographing the laminated film, so that a gradation average value of a carbon deposition layer in a cross-sectional sample of the laminated film becomes 80 to 90 with a standard deviation of 3 to 5, dividing the inorganic polymer layer in the transmission electron microscope image into twenty parts, so that the divided parts have an equal film thickness in a film thickness direction, obtaining a standard deviation from histogram for total grayscale distribution at 256 gradations when each cross section of 3rd to 18th divisions is gray scale-displayed at 256 gradations, and calculating a standard deviation ($\sigma$) as an average value thereof;

(b) standard deviations ($\sigma n$) of the contrast of each of n divided parts are calculated, the standard deviation $\sigma n$ is obtained by:

dividing an electron beam-irradiated part of the inorganic polymer layer into twenty parts (n=1~20, $\sigma n$=standard deviation of nth division) so that the divided parts have an equal film thickness in a film thickness direction, irradiating a cross-sectional sample of the laminated film with an electron beam at $1.30\times10^{16}$ ions/cm$^2$, and obtaining a second transmission electron microscope image by photographing a cross section of each divided part of the inorganic polymer layer after the irradiating electron beam under the same conditions to photograph the laminated film, set in (a), calculating a standard deviation from histogram for total grayscale distribution at 256 gradations when the second transmission electron microscope image is gray scale-displayed at 256 gradations;

(c) Xn (n=1~20) of each divided part is calculated from the expression (1):

$$Xn = \sigma n/\sigma(n=1\sim 20) \quad (1)$$

(d) Y is defined as a standard deviation of X3 to X18, wherein the water vapor transmission rate under the conditions of a temperature of 40° C. becomes $3.9\times10^{-5}$ g/m$^2$/day or less; and wherein the inorganic polymer layer is a layer consisting of a curing product of a composition comprising polysilazane.

2. The laminated film according to claim 1, wherein the gas barrier layer is a silicon oxide-based layer which contains silicon atoms, oxygen atoms and carbon atoms, and satisfies all of the conditions (i) to (iii), in a silicon distribution curve, an oxygen distribution curve, and a carbon distribution curve, each of the silicon distribution curve, oxygen distribution curve, and carbon distribution curve showing a relationship between a distance from a surface of the gas barrier layer in a film thickness direction of the gas barrier layer, and the distribution ratio of silicon, oxygen, and carbon, respectively, wherein the distribution ratio of silicon, oxygen, and carbon is the ratio of an amount of a silicon atom (atomic ratio of silicon), oxygen atom (atomic ratio of oxygen), or carbon atom (atomic ratio of carbon), to a total amount of a silicon atom, an oxygen atom and a carbon atom, respectively, (i) the atomic ratio of silicon, the atomic ratio of oxygen and the atomic ratio of carbon satisfy the expression (2):

$$(\text{Atomic ratio of oxygen}) > (\text{atomic ratio of silicon}) > (\text{atomic ratio of carbon}) \quad (2)$$

in a region of 90% or more of a film thickness of the gas barrier layer;

(ii) the carbon distribution curve has at least one extreme value;

(iii) an absolute value of a difference between a maximum value and a minimum value of the atomic ratio of carbon in the carbon distribution curve is 5 atomic % or more.

3. The laminated film according to claim 1, wherein the gas barrier layer contains silicon atoms, oxygen atoms and nitrogen atoms, and the gas barrier layer is a silicon oxide-based layer satisfying all of the following conditions (iv) and (v):

(iv) the gas barrier layer has a second thin film layer, a first thin film layer and a third thin film layer which have different oxygen content ratios, from a resin substrate 101 side, and an average composition of silicon atoms, oxygen atoms and nitrogen atoms of the first thin film layer is in the range of 10 atomic %≤Si≤40 atomic %, 5 atomic %≤O≤30 atomic %, 50 atomic %≤N≤80 atomic %;

(v) the elemental ratio of a nitrogen atom and a silicon atom in each of the second and third thin film layers is in the range of the expression (3):

$$N/Si \leq 0.2 \quad (3).$$

4. A process for manufacturing a laminated film comprising at least a gas barrier layer and an inorganic polymer layer cured by vacuum ultraviolet light having a wavelength of 200 nm or less being laminated on a resin substrate, comprising:

a step of forming the gas barrier layer by chemical vapor deposition, wherein a Y value calculated from a transmission electron microscope image of a cross section of the inorganic polymer layer by the following procedures (a) to (d) is 0.180 or less:

(a) a standard deviation ($\sigma$) of the contrast of an electron beam-unirradiated part of the inorganic polymer layer is calculated the standard deviation $\sigma$ is obtained by performing division into twenty parts of the inorganic polymer layer of a transmission electron microscope image obtained by photographing so that a gradation average value of a carbon deposition layer in a cross-sectional sample of the laminated film of a width of 90 nm, which was prepared by microsampling using a focused ion beam machining observation device, becomes 80 to 90 with a standard deviation of 3 to 5, so that divided parts have an equal film thickness in a film thickness direction, obtaining a standard deviation from a histogram when each cross section of $3^{rd}$ to $18^{th}$ divisions is gray scale-displayed at 256 gradations, and calculating a standard deviation ($\sigma$) as an average value thereof;

(b) an electron beam-irradiated part of the inorganic polymer layer is divided into twenty parts so that the divided parts have an equal film thickness in a film thickness direction, and a standard deviation of the contrast of each divided part ($\sigma n$: standard deviation of $n^{th}$ division, n=1~20) is calculated, the standard deviation $\sigma n$ is obtained by irradiating a cross-sectional sample of the laminated film having a width of 90 nm, which was prepared by microsampling using a focused ion beam machining observation device, with an electron beam at $1.30\times10^{16}$ ions/cm$^2$, and calculating a standard deviation from a histogram when a transmission electron microscope image obtained by photographing a cross section of each divided part of the inorganic polymer layer after electron irradiation under the same condition as that of a gradation average value of a carbon deposition layer set at (a) is gray scale-displayed at 256 gradations;

(c) Xn (n=1~20) of each divided part is calculated from the expression (1):

$$Xn = \sigma n/\sigma(n=1\sim 20) \quad (1)$$

(d) a standard deviation of X3 to X18 is defined as Y, wherein the water vapor transmission rate under the conditions of a temperature of 40° C. becomes $3.9\times10^{-5}$ g/m2/day or less; and wherein the inorganic polymer layer is a layer consisting of a curing product of a composition comprising polysilazane.

* * * * *